United States Patent
Furuki et al.

(10) Patent No.: US 9,437,357 B2
(45) Date of Patent: Sep. 6, 2016

(54) ROTARY INPUT DEVICE

(71) Applicant: ALPS ELECTRIC CO., LTD., Tokyo (JP)

(72) Inventors: Shigeru Furuki, Miyagi-ken (JP); Yukiharu Hayashi, Miyagi-ken (JP); Hiroshi Hashira, Miyagi-ken (JP); Yoshiyuki Iwazaki, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/569,400

(22) Filed: Dec. 12, 2014

(65) Prior Publication Data

US 2015/0221426 A1 Aug. 6, 2015

(30) Foreign Application Priority Data

Jan. 31, 2014 (JP) .................................. 2014-016542

(51) Int. Cl.
*H01H 9/00* (2006.01)
*H01F 7/02* (2006.01)
*G05G 1/08* (2006.01)
(Continued)

(52) U.S. Cl.
CPC ............... *H01F 7/021* (2013.01); *G01B 7/003* (2013.01); *G01B 7/30* (2013.01); *G05G 1/08* (2013.01); *G05G 5/03* (2013.01); *G06F 3/0362* (2013.01); *H01F 7/20* (2013.01); *H01H 5/02* (2013.01); *H01H 19/11* (2013.01); *H03K 17/97* (2013.01); *G01B 2210/58* (2013.01); *H01H 25/06* (2013.01); *H01H 2003/506* (2013.01); *H03K2217/94068* (2013.01); *H03K 2217/96062* (2013.01)

(58) Field of Classification Search
CPC ............ H01F 7/20; H01F 7/021; H01F 7/02; G01B 7/00; G01B 7/30; G01B 7/003; H02K 11/00
USPC ........................................................ 335/205
See application file for complete search history.

(56) References Cited

U.S. PATENT DOCUMENTS 6,020,663 A * 2/2000 Furuki .................. H02K 29/12
310/268
6,166,475 A * 12/2000 Furuki ............... G11B 19/2009
310/156.26
(Continued)

FOREIGN PATENT DOCUMENTS

JP 2003-280799 10/2003

OTHER PUBLICATIONS

Search Report dated Jun. 2, 2015 from European Patent Application No. 14198785.9.

*Primary Examiner* — Shawki S Ismail
*Assistant Examiner* — Lisa Homza
(74) *Attorney, Agent, or Firm* — Beyer Law Group LLP

(57) ABSTRACT

A rotary input device includes a first annular magnetic body in which a plurality of outward protrusions protruding toward an outside in a radial direction are disposed along a circumferential direction, a second annular magnetic body in which a plurality of inward protrusions formed to oppose the outward protrusions of the first magnetic body are disposed along a circumferential direction, and a rotary knob configured to relatively rotate the first magnetic body and the second magnetic body. The first magnetic body includes a magnet in which opposing surfaces facing each other are vertically disposed and which is magnetized to two poles of an upper pole and a lower pole including the opposing surfaces, a pair of yokes that interposes the opposing surfaces of the magnet vertically, and the outward protrusion formed on the pair of yokes.

4 Claims, 25 Drawing Sheets

(51) Int. Cl.
  *G05G 5/03* (2008.04)
  *H01H 5/02* (2006.01)
  *G06F 3/0362* (2013.01)
  *G01B 7/00* (2006.01)
  *G01B 7/30* (2006.01)
  *H01F 7/20* (2006.01)
  *H01H 19/11* (2006.01)
  *H03K 17/97* (2006.01)
  *H01H 25/06* (2006.01)
  *H01H 3/50* (2006.01)

(56) References Cited

U.S. PATENT DOCUMENTS

| | | | | |
|---|---|---|---|---|
| 6,182,370 B1* | 2/2001 | Baur | ............ | G01D 5/2451 33/1 N |
| 8,143,981 B2* | 3/2012 | Washizu | ............ | H01H 25/002 335/205 |
| 8,294,049 B2* | 10/2012 | Tsuduki | ............ | H01H 25/065 200/5 R |
| 2001/0019230 A1* | 9/2001 | Furuki | ............ | H02K 29/14 310/68 B |
| 2005/0072910 A1* | 4/2005 | Hayashi | ............ | H01H 25/06 250/231.13 |
| 2005/0077156 A1* | 4/2005 | Ushimaru | ............ | G05G 9/047 200/6 A |
| 2005/0190153 A1* | 9/2005 | Ushimaru | ............ | G05G 9/04796 345/161 |
| 2006/0072300 A1* | 4/2006 | Hayashi | ............ | H01H 25/065 362/23.18 |
| 2006/0278011 A1* | 12/2006 | Miyasaka | ............ | G06F 3/0338 73/753 |
| 2008/0197004 A1 | 8/2008 | Ishigaki et al. | | |

\* cited by examiner

FIG. 2
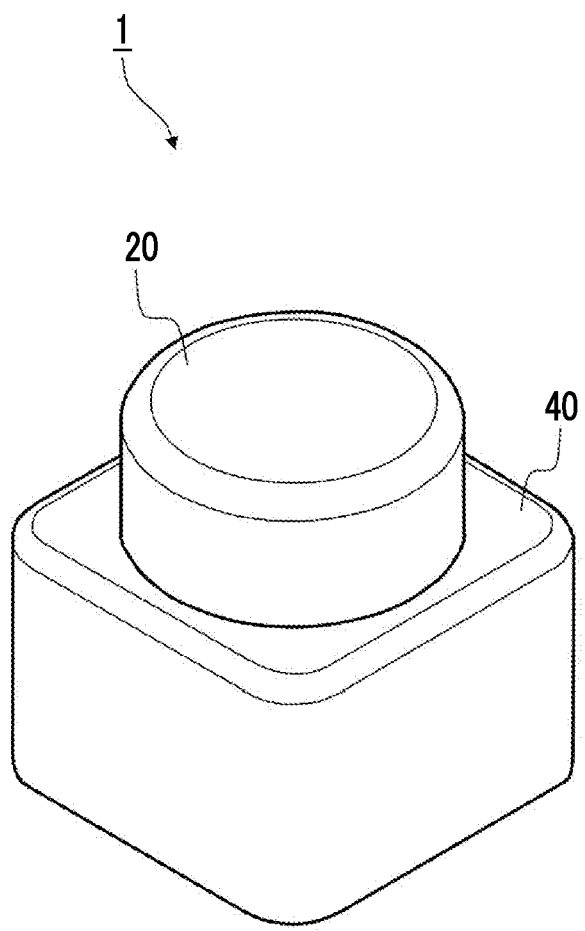
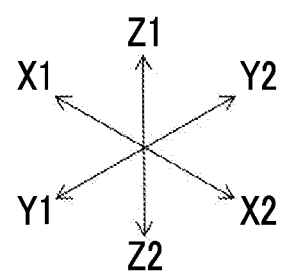

FIG. 9
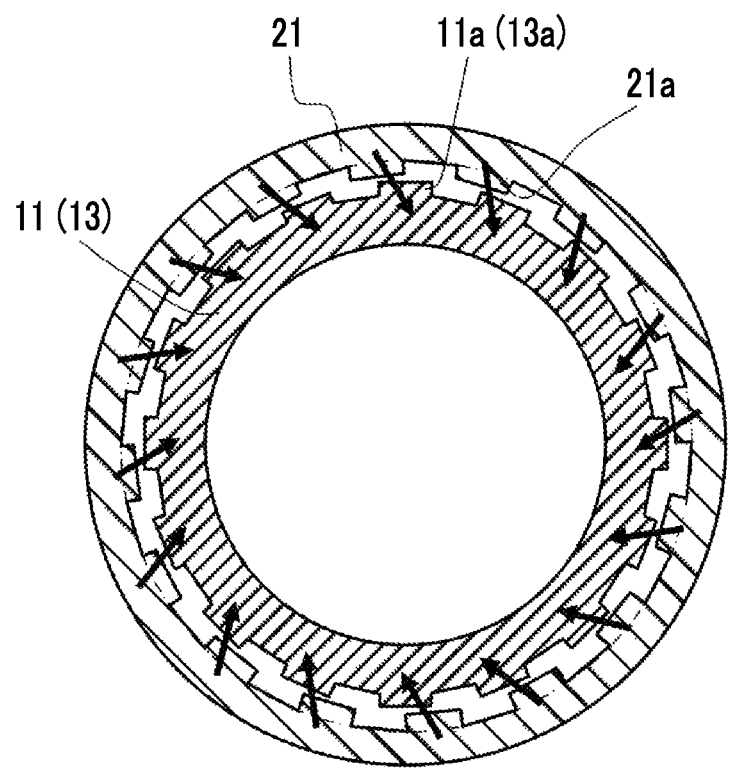
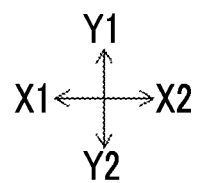

FIG. 16
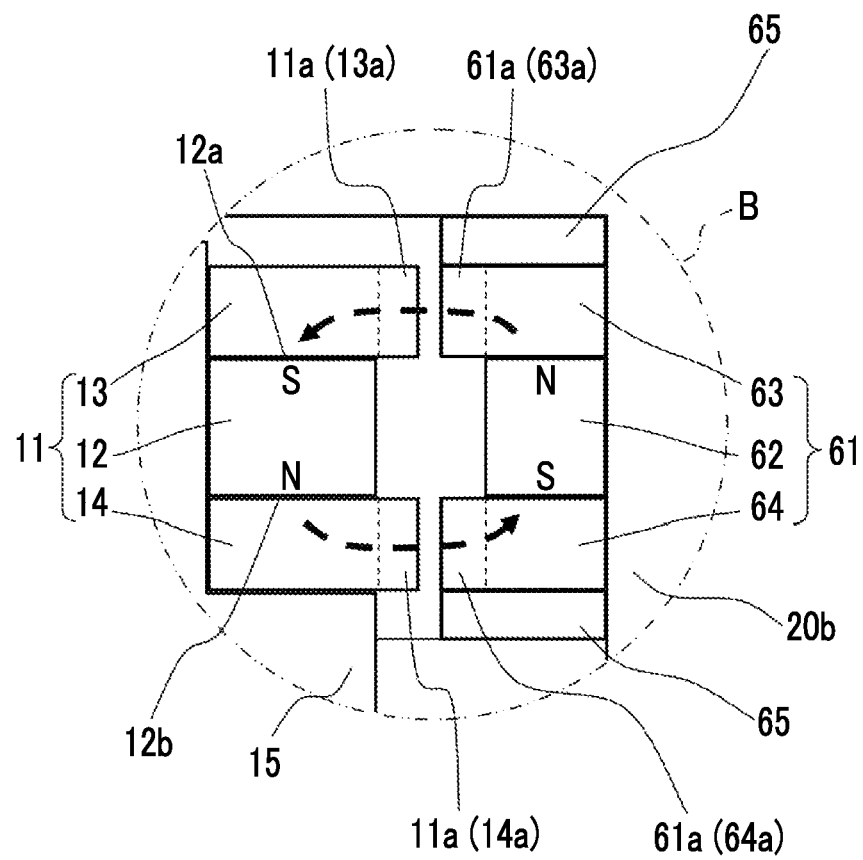
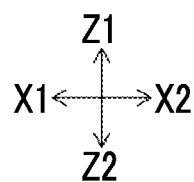

FIG. 21
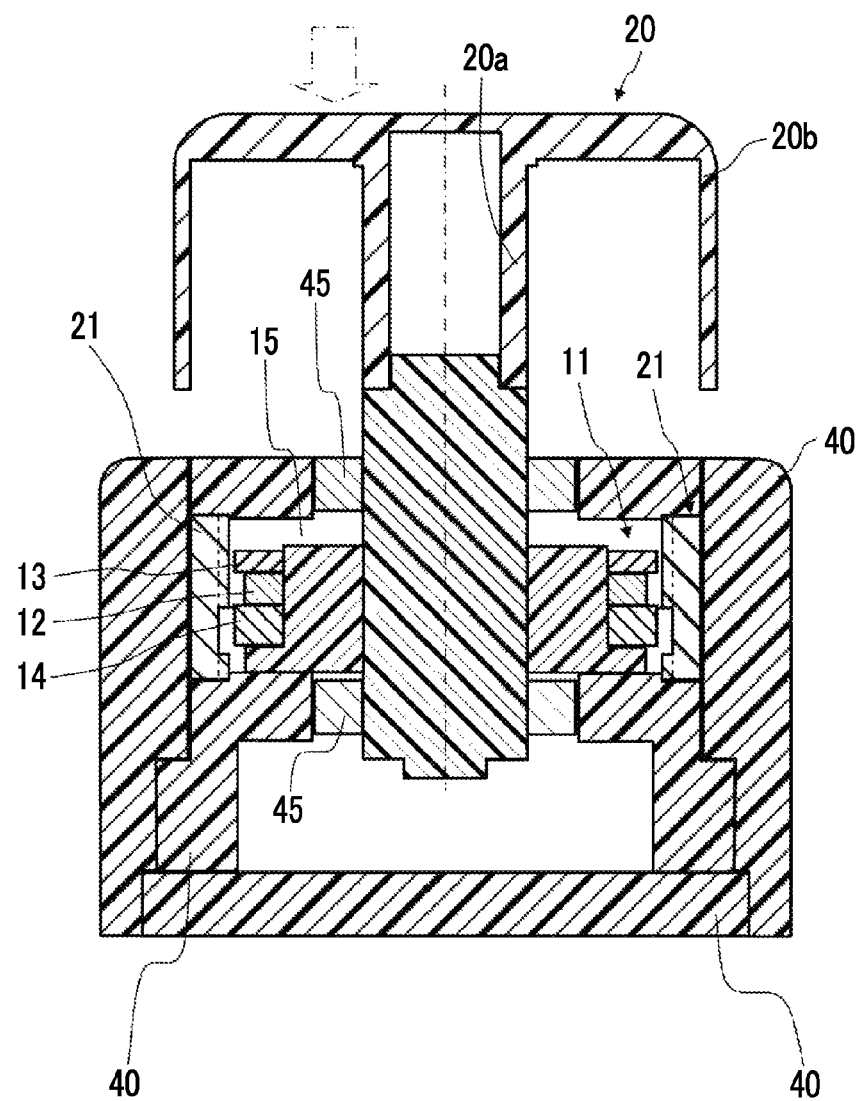
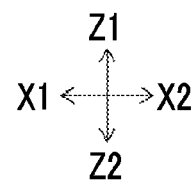

FIG. 22
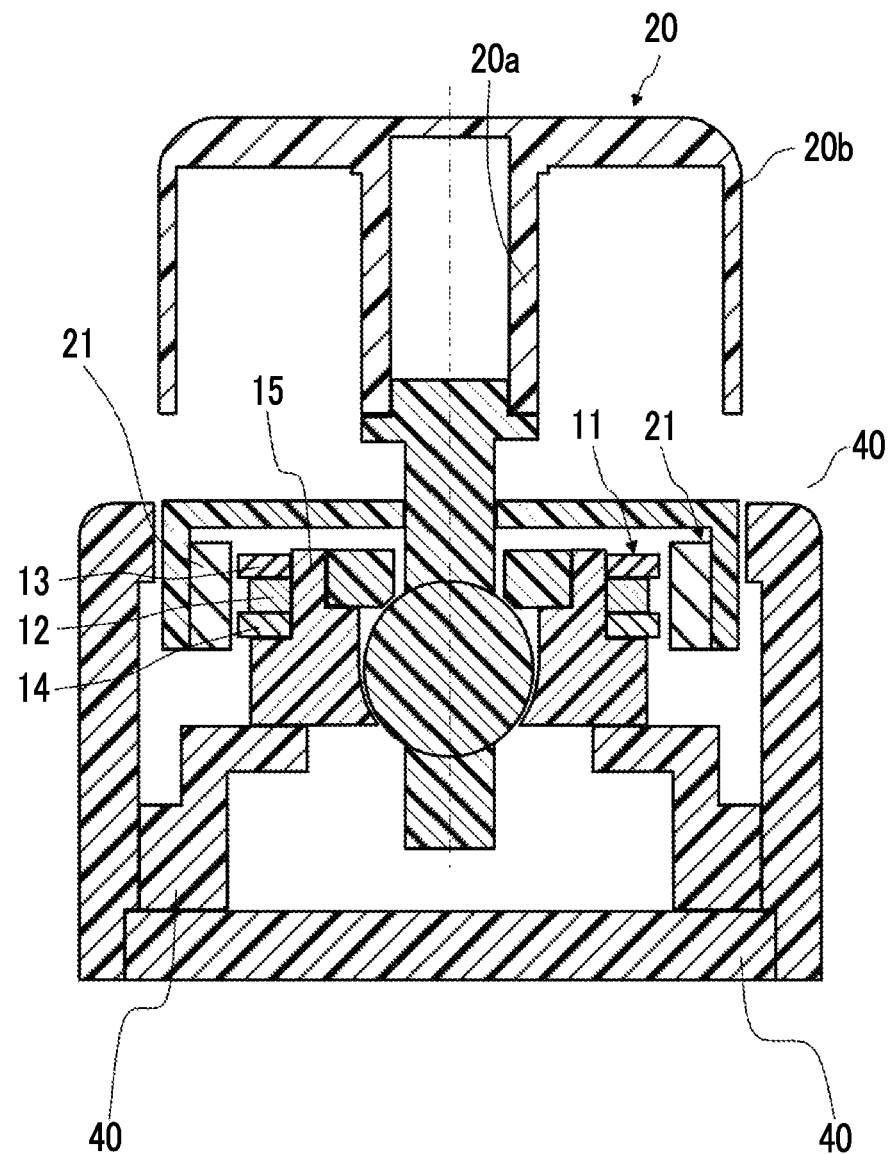
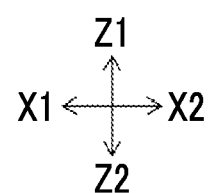

ROTARY INPUT DEVICE

CLAIM OF PRIORITY

This application claims benefit of Japanese Patent Application No. 2014-016542 filed on Jan. 31, 2014, which is hereby incorporated by reference.

BACKGROUND OF THE INVENTION

1. Field of the Invention

The present invention relates to a rotary input device by which a click feeling can be obtained.

2. Description of the Related Art

In recent years, a rotary input device by which a click feeling can be obtained is used in various industrial fields. For example, an information input device for rotation detection is disclosed in Japanese Unexamined Patent Application Publication No. 2003-280799.

FIG. 24 is an exploded perspective view showing an information input device 100 disclosed in Japanese Unexamined Patent Application Publication No. 2003-280799. FIGS. 25A and 25B are perspective views showing a rotation detection magnetic body 152 of FIG. 24, FIG. 25A is a perspective view showing a positional relationship of a hall IC 136a with respect to a rotation detection magnetic body 152, and FIG. 25B is a perspective view showing a portion of the rotation detection magnetic body 152 in an enlarged manner.

A holding ring 164 and an operation dial 154 are in a state of being rotatably held on a base 120, and if the holding ring and the operation dial are pressed, the holding ring and the operation dial are mounted to turn a central tact switch 133 on. Moreover, in the operation dial 154, if where the center portion of the operation dial is separated vertically and horizontally is pressed from the upper portion, the operation dial acts on the tact switch 132 and turns the tact switch on.

A click feeling generating magnetic body 142 is configured of two arc pieces 144a and 144b, and two arc pieces are integrally held by one annular holding portion 146 and are positioned on one circumference. The arc pieces 144a and 144b are formed of a magnetic body, and thus, are magnetized to bear magnetism. The rotation detection magnetic body 152 is integrally mounted to the operation dial 154. An outer diameter of the rotation detection magnetic body 152 is larger than an outer diameter of the click feeling generating magnetic body 142, and similar to the arc pieces 144a and 144b, the rotation detection magnetic body is formed of a magnetic body, and thus, is magnetized to bear magnetism.

A magnetic field defined by magnetic poles of the rotation detection magnetic body 152 is detected by hall ICs 136a and 136b, and if the operation dial 154 is rotated, strength of the detected magnetic field is changed, and thus, it is possible to detect a rotation amount and a rotation direction of the operation dial 154.

The click feeling generating magnetic body 142 is positioned inside the rotation detection magnetic body 152 and magnetically interacts with the rotation detection magnetic body 152, and if the operation dial 154 is rotated, a click feeling is generated by the magnetic interaction. The rotation detection magnetic body 152 is formed in a doughnut shape, and as shown in FIG. 25A, N poles and S poles are alternately disposed with a constant pitch when viewed from the above. As shown in FIG. 25B, in a portion of the N pole when viewed from the above, the upper side becomes the N pole and the lower side becomes the S pole. Moreover, in a portion of the S pole when viewed from the above, the upper side becomes S pole and the lower side becomes N pole. This makes the rotation detection magnetic body 152 magnetize vertically for each range corresponding to the pitch. The click feeling generating magnetic body 142 is also magnetized by the similar method.

According to the magnetic interaction between the rotation detection magnetic body 152 and the click feeling generating magnetic body 142, the click feeling is generated for each disposition angle pitch of the sets of the N poles and the S poles. Accordingly, for example, it is possible to remove unevenness or variation in the click feeling generated due to dimensional errors or wear of the rotation detection magnetic body 152 or the click feeling generating magnetic body 142.

However, in the rotation detection magnetic body 152 and the click feeling generating magnetic body 142, the S poles and the N poles are alternately disposed in the circumferential direction, and for example, complicated magnetizing means in which the positions of the poles are slightly deviated and the poles are magnetized is required. Therefore, there is a problem that a cost according to the magnetization is increased. Moreover, when magnetic attraction is not strong, it is not possible to obtain an improved click feeling.

SUMMARY OF THE INVENTION

The present invention provides a rotary input device capable of decreasing a cost required for a structure to obtain a click feeling and obtaining an improved click feeling.

According to an aspect of the present invention, there is provided a rotary input device including: a first annular magnetic body in which a plurality of outward protrusions protruding toward an outside in a radial direction are disposed along a circumferential direction; a second annular magnetic body in which a plurality of inward protrusions formed to oppose the outward protrusions of the first magnetic body are disposed along a circumferential direction; and a rotary knob configured to relatively rotate the first magnetic body and the second magnetic body, in which at least one of the first magnetic body and the second magnetic body includes a magnet in which opposing surfaces facing each other are vertically disposed and which is magnetized to two poles of an upper pole and a lower pole including the opposing surfaces, a pair of yokes that interposes the opposing surfaces of the magnet vertically, and the outward protrusion or the inward protrusion formed on the pair of yokes.

According to this configuration, the upper surface and the lower surface of the magnet magnetized to two poles vertically are interposed by the yokes, the outward protrusions or the inward protrusions are formed on the yokes, and thus, it is possible to effectively transmit the magnetic flux of the magnet to opposing magnetic bodies. Therefore, the magnetic attraction is increased, and it is possible to improve the click feeling generated when the rotary knob is operated by the change of the magnetic attraction. Since the magnet is vertically magnetized, a simple structure is obtained even when the magnet is an annular shape, and the manufacturing of the magnet is easy. Accordingly, it is possible to provide the rotary input device in which the cost can be decreased and the click feeling is improved.

In addition, in the rotary input device of the aspect, the rotary input device may include a case member configured to rotatably support the rotary knob, the cam member may be interposed between the case member and the rotary knob, and the cam member may position the rotary knob with a rotation position at which the inward protrusion and the outward protrusion oppose each other as a defined position, and may apply an operation reaction force to the rotary knob when the rotary knob is rotated from the defined position.

According to this configuration, since the cam member applies the operation reaction force to the rotary knob, it is possible to prevent the rotary knob from not being stopped and being continuously vibrated, and it is possible to limit the continuous rotation. Moreover, since the click feeling is generated by the change of the magnetic attraction, it is possible to decrease the operation reaction force generated in the cam member. Accordingly, since the friction force or the like applied to the cam member is decreased, wear is decreased and the lifespan can be lengthened.

Moreover, in the rotary input device of the aspect, the cam member may include a spherical body, an elastic body that biases the spherical body, and a sliding portion that is formed in a concave shape or a convex shape continuous to the rotary knob, the sliding portion may have a rotation position at which the inward protrusion and the outward protrusion oppose each other as a maximum point of the concave shape, a rotation position corresponding to an intermediate position between the inward protrusion and the outward protrusion may be set to a maximum point of the convex shape when the inward protrusion and the outward protrusion are relatively rotated, and the spherical body may move on the sliding portion against an elastic force applied from the elastic member according to the operation of the rotary knob.

According to this configuration, since the cam member can be configured by a simple structure, it is possible to decrease the cost. In addition, since the click feeling is generated by the change of the magnetic attraction, it is possible to decrease the elastic force of the elastic member generating the operation reaction force, and thus, the operation sound or the wear due to the sliding is not easily generated.

In addition, in the rotary input device of the aspect, each of the first magnetic body and the second magnetic body may include the magnet, the pair of yokes, and the outward protrusion or the inward protrusion formed on the pair of yokes, and the magnet of the first magnetic body and the magnet of the second magnetic body may be positioned to be vertically inverted to each other and to be magnetized.

According to this configuration, the first magnetic body and the second magnetic body respectively include the magnets, the magnets are disposed to attract each other, and thus, it is possible to further increase the magnetic attraction.

Moreover, in the rotary input device of the aspect, the magnet may be an electromagnet including a core material and a coil material wound around the core material.

According to this configuration, the magnet is an electromagnet, and since it is possible to control the magnetic attraction by energizing the coil material, it is possible to freely change the operation feeling.

BRIEF DESCRIPTION OF THE DRAWINGS

FIG. 2 is a perspective view showing the rotary input device of the first embodiment;
FIG. 9 is an explanatory view showing magnetic attraction when the second magnetic body is rotated from the defined position;
FIG. 16 is an explanatory view showing flows of magnetic flux of a first magnetic body and a second magnetic body in a B portion of FIG. 15;
FIG. 21 is a cross-sectional view showing the first modification of the first embodiment, and is an explanatory view of a pushing-down operation;
FIG. 22 is a cross-sectional view showing a second modification of the first embodiment;
FIG. 25A is a perspective view showing a positional relationship of a hall IC with respect to the rotation detection magnetic body,
and FIG. 25B is a perspective view showing a portion of the rotation detection magnetic body in an enlarged manner.

DESCRIPTION OF THE PREFERRED EMBODIMENTS

Figure 1:
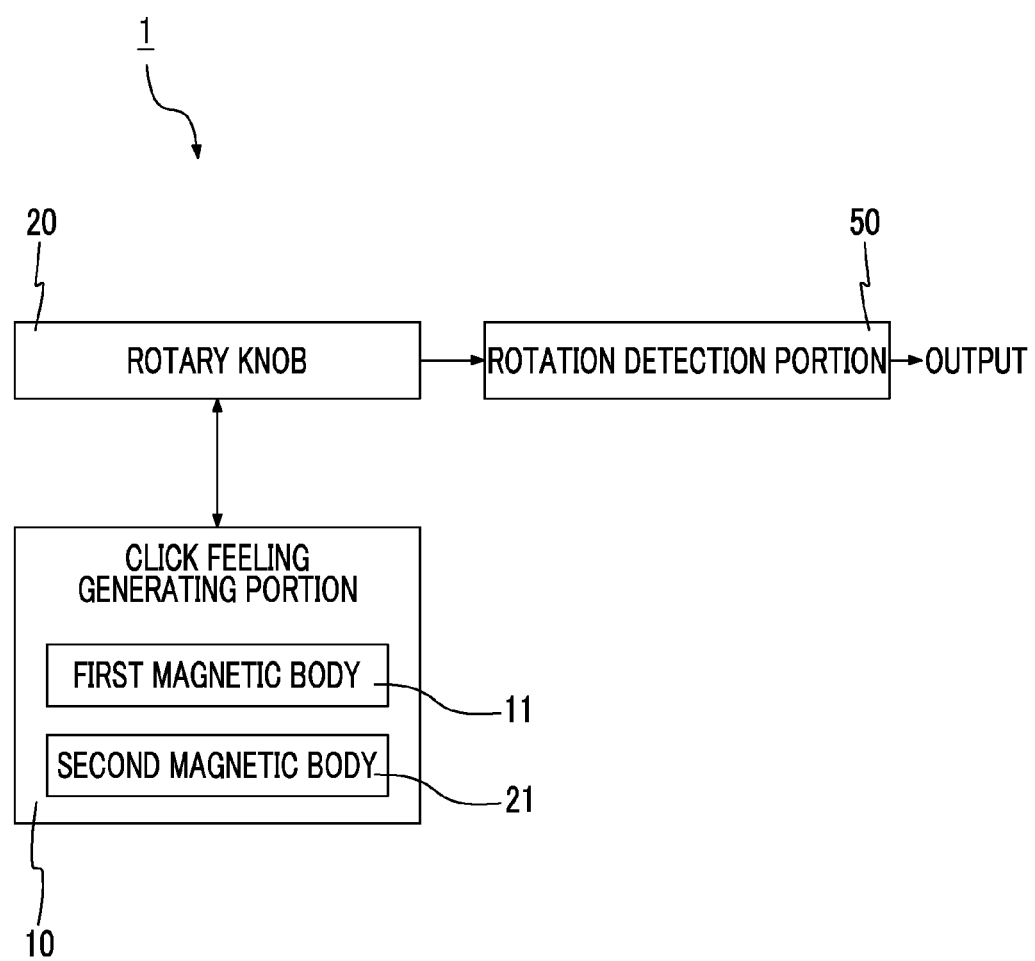
FIG. 1 is a block diagram showing a rotary input device of a first embodiment of the present invention.

Hereinafter, embodiments of the present invention will be described in detail with reference to the drawings. Moreover, for convenience of understanding, scales in the drawings are appropriately changed.

First Embodiment

Figure 3:
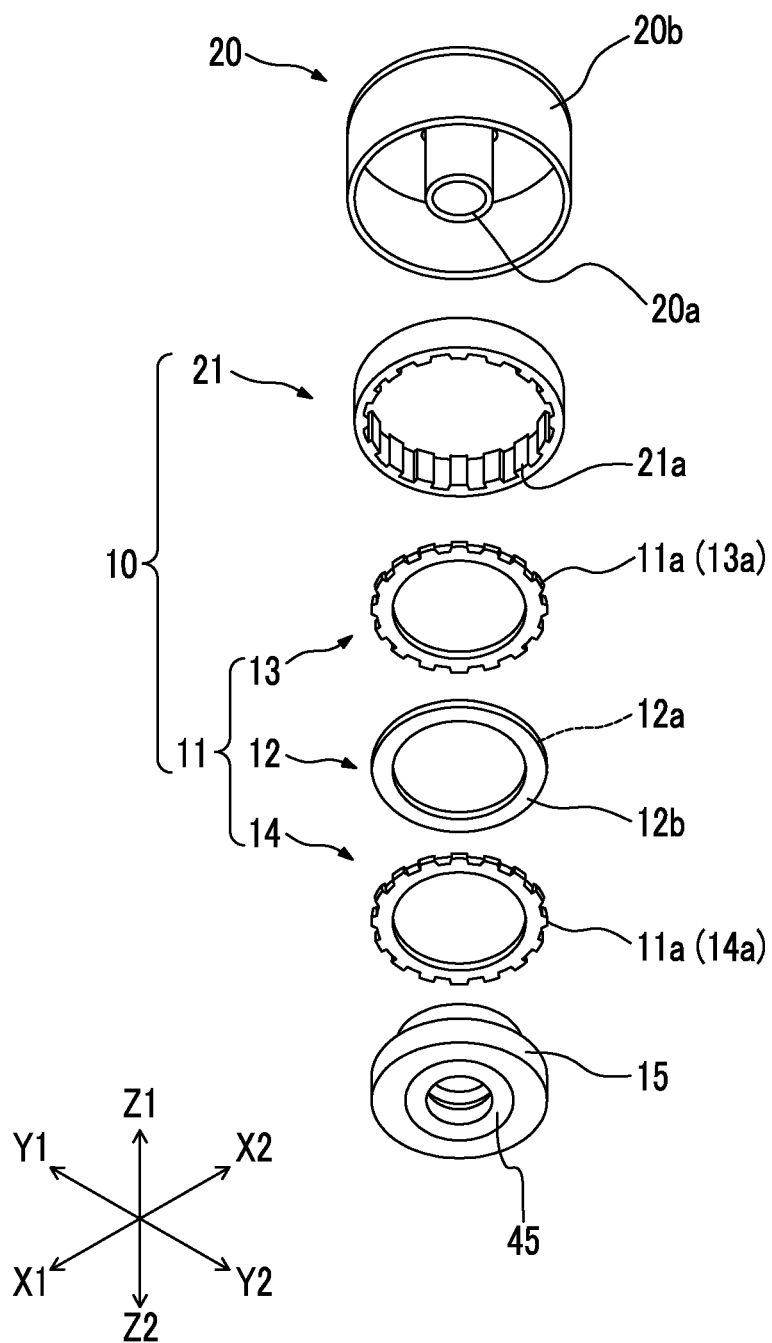
FIG. 3 is an exploded perspective view showing a rotary knob and a click feeling generating portion in the rotary input device of the first embodiment.
Figure 4:
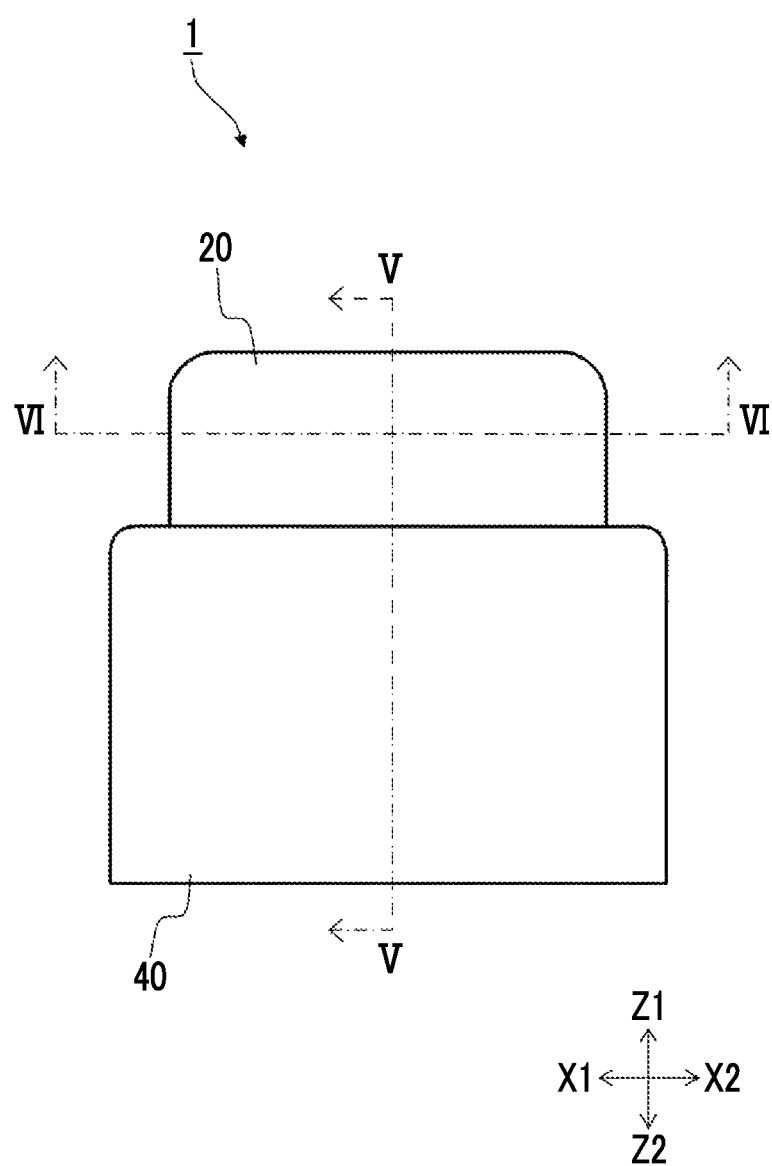
FIG. 4 is a front view showing the rotary input device of the first embodiment.
Figure 5:
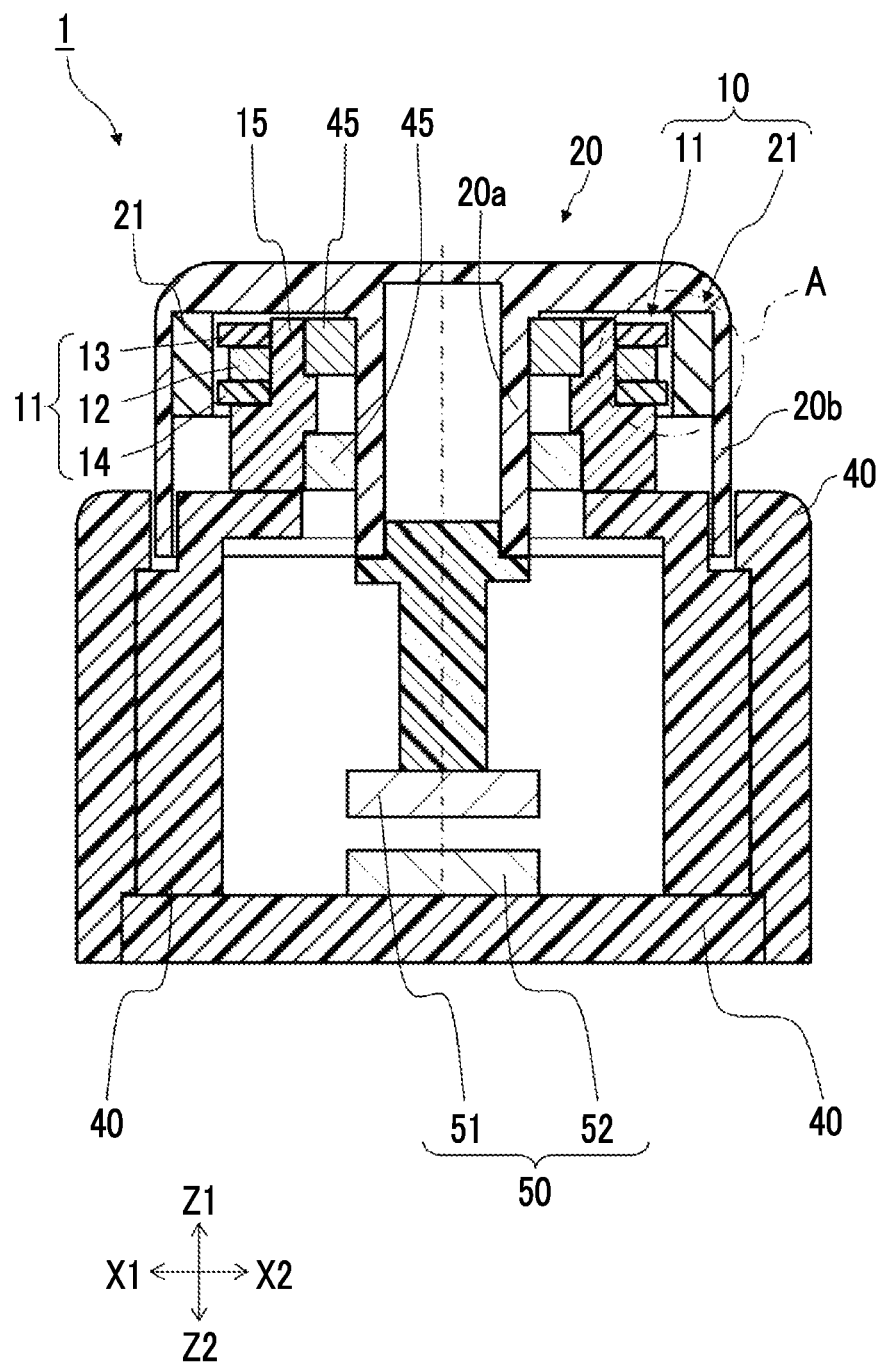
FIG. 5 is a cross-sectional view taken along line V-V of FIG. 4.
Figure 6:
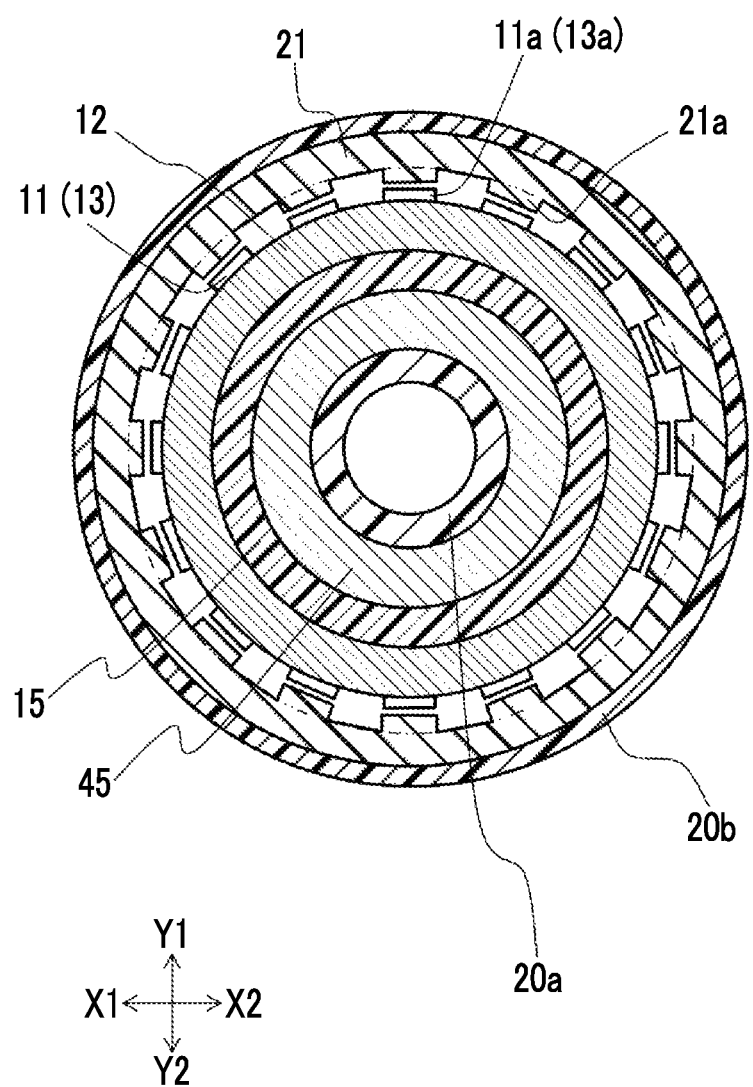
FIG. 6 is a cross-sectional view taken along line VI-VI of FIG. 4.

FIG. 1 is a block diagram showing a rotary input device 1 of a first embodiment of the present invention. FIG. 2 is a perspective view showing the rotary input device 1 of the first embodiment. FIG. 3 is an exploded perspective view showing a rotary knob 20 and a click feeling generating portion 10 in the rotary input device 1 of the first embodiment. FIG. 4 is a front view showing the rotary input device 1 of the first embodiment. FIG. 5 is a cross-sectional view taken along line V-V of FIG. 4. FIG. 6 is a cross-sectional view taken along line VI-VI of FIG. 4.

The rotary input device 1 of the present embodiment is a mechanism by which an operator performing a rotation input operation of the rotary knob 20 obtains a click feeling. More specifically, the rotary input device is used for an input operation mechanism used in an input operation of electronic equipment or a vehicle. For example, different operation contents are input according to a rotation angle from a predetermined rotation position. As shown in FIG. 1, a rotation detection portion 50 detecting a rotation angle of the rotary knob 20 is provided, and rotation angle information detected by the rotation detection portion 50 is output to electronic equipment or the like. Moreover, the rotation detection portion 50 detects not only the rotation angle but also a rotation direction or a rotational speed, for example.

The rotary knob 20 is a molding member that includes a cylindrical operating portion 20b, and a shaft portion 20a that is concentrically formed with the operating portion 20b. The rotary knob 20 is accommodated in a case member 40 that rotatably supports the rotary knob 20, and the operating portion 20b protrudes from an opening of the case member 40. In descriptions below, Z1 side of FIG. 2 is defined as an upper side, and Z2 side is defined as a lower side. However, the directions do not limit directions during use.

The click feeling generating portion 10 is accommodated between the operating portion 20b of the rotary knob 20 and the shaft portion 20a. The click feeling generating portion 10 is disposed so that a first magnetic body 11 and a second magnetic body 21 are rotated relative to each other.

The first magnetic body 11 is an annular member in which a plurality of outward protrusions 11a protruding toward the outside in a radial direction are disposed along a circumferential direction, and includes a magnet 12 that is magnetized to two poles of an upper pole and a lower pole, and a pair of yokes 13 and 14 that interposes the magnet 12 vertically.

The magnet 12 is a permanent magnet molded in an annular shape, and in the magnet, opposing surfaces 12a and 12b facing each other are disposed vertically, and the magnet is magnetized to two poles of the upper pole and the lower pole including the opposing surfaces 12a and 12b.

The pair of yokes 13 and 14 are magnetic materials formed in annular shapes, and in the present embodiment, a steel material is used. As shown in FIG. 3, a plurality of outward protrusions 13a (16 outward protrusions in FIG. 3) which are outward protrusions 11a are formed on the outer circumference of the yoke 13. Similarly, a plurality of outward protrusions 14a (16 outward protrusions in FIG. 3) which are outward protrusions 11a are formed on the outer circumference of the yoke 14. The first magnetic body 11 is fitted to a fixing member 15 while interposing the magnet 12 so that the outward protrusions 13a and 14a of the yokes 13 and 14 overlap with one another vertically. The outward protrusions 13a and 14a of the yokes 13 and 14 protrude to the outside in the radial direction from the outer diameter of the magnet 12, and outer diameters of virtual circles of portions in which the outward protrusions 13a and 14a are not formed are approximately the same as the outer diameter of the magnet 12.

The second magnetic body 21 of the present embodiment is an annular magnetic material that is concentrically disposed with the first magnetic body 11, and in the present embodiment, a steel material is used for the second magnetic body. As shown in FIG. 3, a plurality of inward protrusions 21a are formed on the inner circumferential surface of the second magnetic body 21 along the circumferential direction. As shown in FIG. 5, the length of each inward protrusion 21a is lengthened vertically (Z1-Z2 direction) to oppose each of the outward protrusion 13a of the yoke 13 and the outward protrusion 14a of the yoke 14 in the first magnetic body 11. Moreover, the inward protrusion 21a and the outward protrusion 11a (13a and 14a) are disposed so that a rotation position at which the inward protrusion 21a and the outward protrusion 11a (13a and 14a) oppose each other becomes a defined position (refer to FIGS. 6 and 7).

In the present embodiment, the second magnetic body 21 is inserted to be fixed to the operating portion 20b of the rotary knob 20 so that the second magnetic body is integrally rotated with the rotary knob 20. On the other hand, as shown in FIGS. 2 to 6, the first magnetic body 11 is fitted to the fixing member 15 and fixed to the case member 40. The shaft portion 20a of the rotary knob 20 is inserted into the fixing member 15 via a rotary introduction member 45, and the first magnetic body 11 and the second magnetic body 21 are concentrically held in a non-contact state.

As shown in FIG. 5, a rotation angle sensor 52 detecting a rotation angle of the rotary knob 20 is disposed in the case member 40, and a rotation angle detection magnet 51 attached to the shaft portion 20a of the rotary knob 20 and the rotation angle sensor 52 configure a rotation detection portion 50. In addition, wires or the like for leading an output of the rotation angle sensor 52 to the outside of the case member 40 are omitted.

Next, an operation in which the rotary input device 1 of the present embodiment applies operation feeling of the rotary knob 20 will be described.

Figure 7:
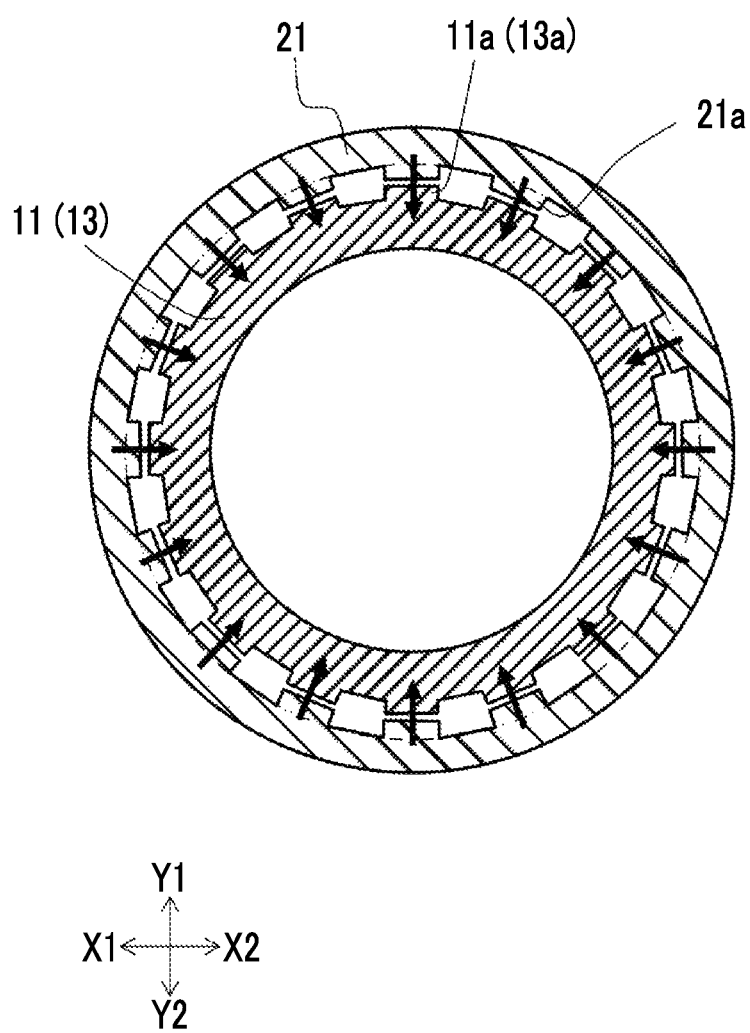
FIG. 7 is an explanatory view showing a defined position of an initial state where a first magnetic body and a second magnetic body are relatively rotated.
Figure 8:
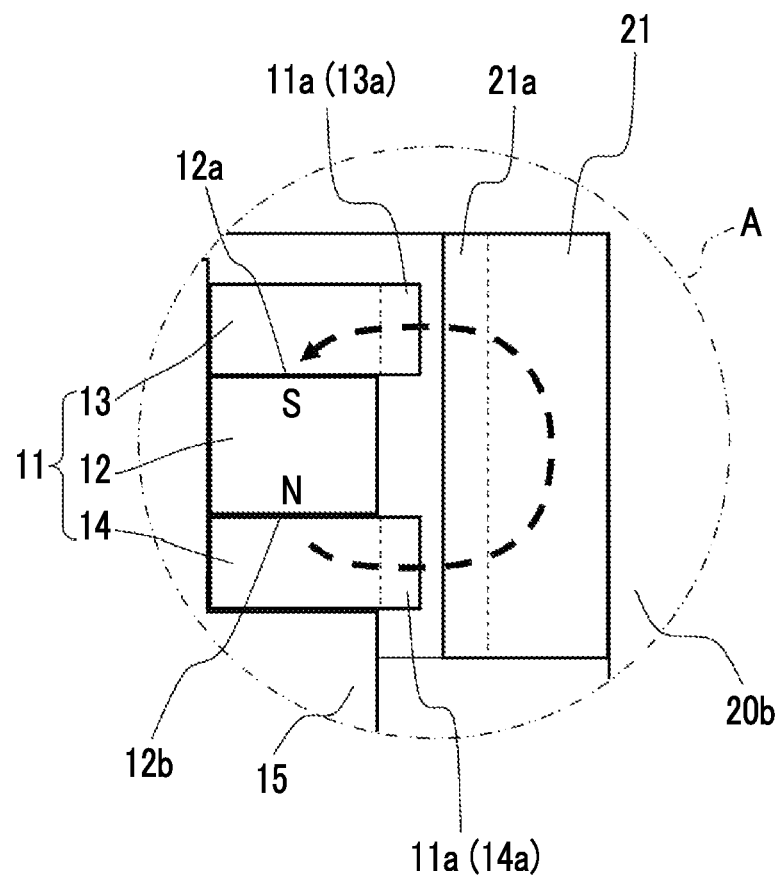
FIG. 8 is an explanatory view showing flows of magnetic flux of the first magnetic body and the second magnetic body in an A portion of FIG. 5.
Figure 10:
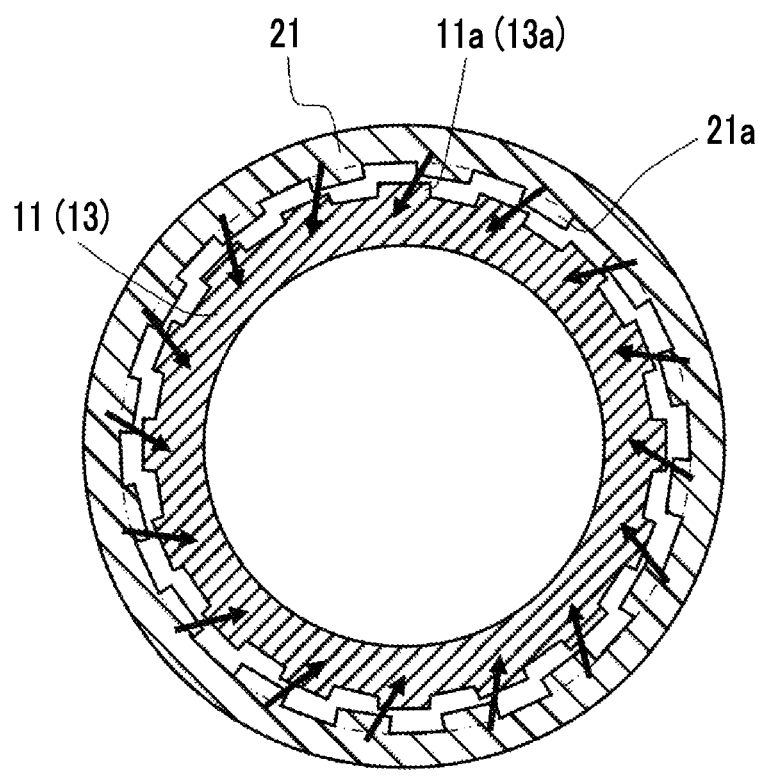
FIG. 10 is an explanatory view showing magnetic attraction when the second magnetic body is further rotated from the defined position.

FIG. 7 is an explanatory view showing the defined position of an initial state where the first magnetic body 11 and a second magnetic body 21 are relatively rotated. FIG. 8 is an explanatory view showing flows of magnetic flux of the first magnetic body 11 and the second magnetic body 21 in an A portion of FIG. 5. FIG. 9 is an explanatory view showing magnetic attraction when the second magnetic body 21 is rotated from the defined position. FIG. 10 is an explanatory view showing the magnetic attraction when the second magnetic body 21 is further rotated from the defined position.

As shown in FIG. 7, the rotation position at which the inward protrusions 21a and the outward protrusion 11a oppose each other is defined as the defined position. At this time, as shown in FIG. 8, if the magnetic flux of the magnet 12 flows from the N pole to the S pole, a closed loop in which the magnetic flux passes through the outward protrusions 14a of the yoke 14, the inward protrusions 21a of the second magnetic body 21, and the outward protrusions 13a of the yoke 13 is formed. Accordingly, the magnetic attraction is generated between the first magnetic body 11 and the second magnetic body 21, and as shown in FIG. 7, the first magnetic body and the second magnetic body are stable in the defined position at which the inward protrusions 21a and the outward protrusions 11a oppose each other. If the operating portion 20b of the rotary knob 20 is rotated from the defined position, operation feeling is generated by the magnetic attraction.

For example, if the operating portion 20b of the rotary knob 20 is rotated in a counterclockwise direction, the second magnetic body 21 is integrally rotated, and the inward protrusions 21a move from the rotation position at which the inward protrusions oppose the outward protrusions 11a of the first magnetic body 11. At this time, since the magnetic flux from the magnet 12 flows to pass through the outward protrusions 11a and the inward protrusions 21a, as shown in FIG. 9, the magnetic attraction is generated between the outward protrusions 11a and the inward protrusions 21a, and the magnetic attraction operates to suppress the rotation of the second magnetic body 21.

If the operating portion 20b of the rotary knob 20 is further rotated in a counterclockwise direction, since the outward protrusions 11a and the inward protrusions 21a are disposed in plural along the circumferential direction, the inward protrusions 21a of the second magnetic body 21 are close to the outward protrusions 11a adjacent to the defined position. As shown in FIG. 10, if the inward protrusions are away from the rotation position opposing the outward protrusions 11a at the defined position and are close to the adjacent outward protrusions 11a, the magnetic attraction is generated between the outward protrusions 11a, and the magnetic attraction operates to promote the rotation to the opposing position between the outward protrusions 11a and the inward protrusion 21a.

Since the magnetic attraction between the outward protrusions 11a and the inward protrusions 21a repeatedly performs the operation of suppressing the rotation and the operation of promoting the rotation according to the rotation operation of the rotary knob 20, the click feeling which is the operation feeling of the rotary knob 20 is obtained.

In the present embodiment, the magnet 12 is a permanent magnet molded in an annular shape, and the opposing surfaces 12a and 12b facing each other are disposed vertically and are magnetized to two poles of the upper pole and the lower pole including the opposing surfaces 12a and 12b. By magnetizing the magnetic material, in which the opposing surfaces 12a and 12b facing each other are disposed vertically and molded in an annular shape, through a magnetization device magnetizing vertically, the magnet 12 can be manufactured. The shape of the magnet 12 is a simple cylindrical annular shape and the structure of the magnet is a simple structure in which the magnetization direction is a constant direction, and thus, the magnet 12 is easily manufactured.

In addition, the yokes 13 and 14 are formed as separate members, and thus, it is easy to form the outward protrusions 13a and 14a to the yokes 13 and 14. In addition, since the first magnetic body 11 can be obtained only by interposing the upper surface and the lower surface of the magnet 12 with the yokes 13 and 14, compared to a structure in which a magnet having a complicated shape is integrally molded, the manufacturing is easier. Accordingly, since molding means for forming the magnet having a complicated shape is not required and complicated magnetizing means in which positions are slightly deviated and magnetized is not required, it is possible to decrease the cost of the click feeling generating portion 10.

In the rotary input device 1 of the present embodiment, the click feeling of 16 times can be obtained when the rotary knob 20 is rotated once. In addition, this number is not limited. If the number of the outward protrusions 11a and the inward protrusions 21a or a pitch in the circumferential direction is changed, the frequency of the click feeling when the rotary knob is rotated once, the click feeling by the rotation position, or the like can be changed.

Figure 11:
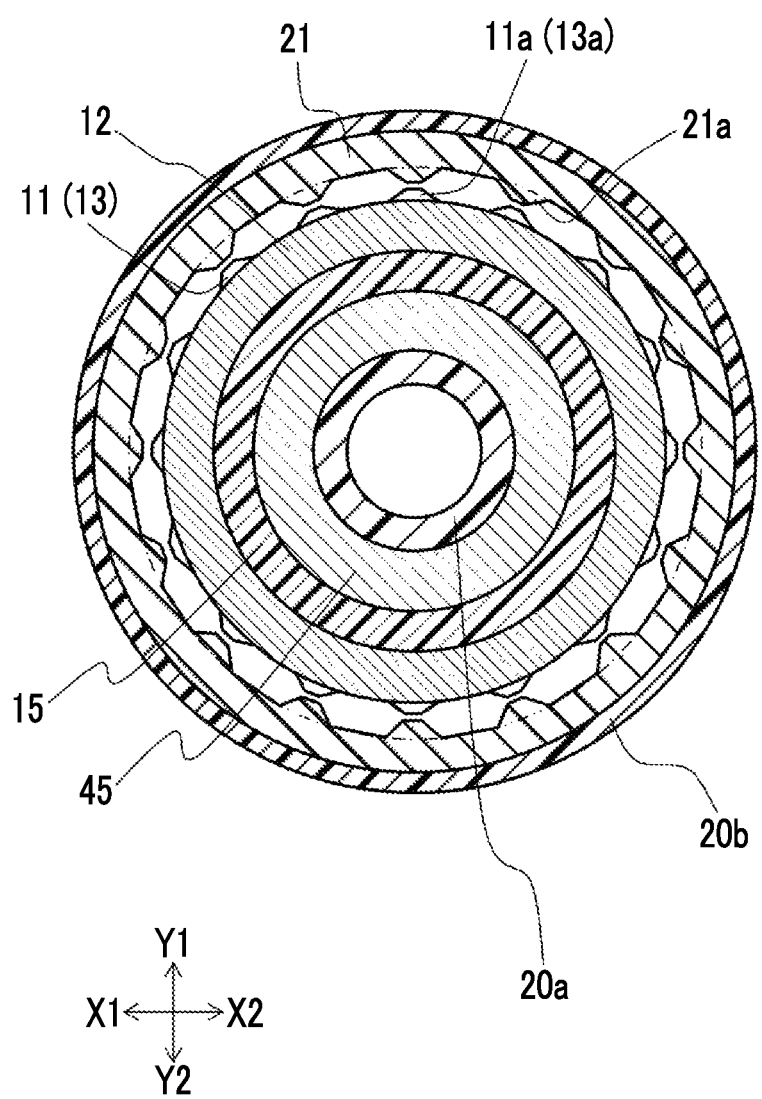
FIG. 11 is an explanatory view showing an example in which a shape of an outward protrusion of the first magnetic body and a shape of an inward protrusion of the second magnetic body are different from each other.
Figure 12:
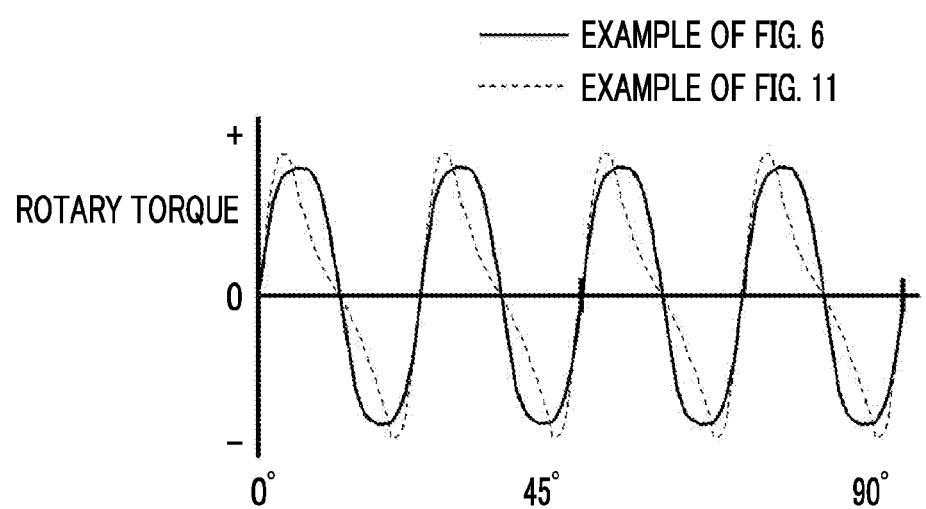
FIG. 12 is an explanatory view in which rotary torque by the magnetic attraction in the examples shown in FIGS. 6 and 11 is compared.

In addition, it is possible to change the click feeling according to shapes of the outward protrusions 11a and the inward protrusions 21a. FIG. 11 is an example of the outward protrusions 11a and the inward protrusions 21a having shapes different from FIG. 6. FIG. 12 is an explanatory view in which rotary torque by the magnetic attraction in examples shown in FIGS. 6 and 11 is compared. As shown in FIG. 12, in the shapes of the outward protrusions 11a and the inward protrusions 21a of FIGS. 6 and 11, the rotary torques by the magnetic attraction are different from each other. Accordingly, the click feeling obtained by the rotary input device 1 is different.

Hereinafter, effects according to the present embodiment will be described.

The rotary input device 1 of the present embodiment includes the first annular magnetic body 11 in which the plurality of outward protrusions 11a protruding toward the outside in the radial direction are disposed along the circumferential direction, the second annular magnetic body 21 in which the plurality of inward protrusions 21a formed to oppose the outward protrusions 11a of the first magnetic body 11 are disposed in the circumferential direction, and the rotary knob 20 that relatively rotates the first magnetic body 11 and the second magnetic body 21. The first magnetic body 11 includes the magnet 12 in which opposing surfaces 12a and 12b facing each other are vertically disposed and which is magnetized to two poles of the upper pole and the lower pole including the opposing surfaces 12a and 12b, the pair of yokes 13 and 14 that interposes the opposing surfaces 12a and 12b of the magnet 12 vertically, and the outward protrusions 11a (13a) and 11a (14a) formed on the pair of yokes 13 and 14.

According to this configuration, the upper surface and the lower surface (opposing surfaces 12a and 12b) of the magnet 12 vertically magnetized to two poles are interposed by the yokes 13 and 14, and the outward protrusions 13a and 14a are formed on the yokes 13 and 14, and thus, it is possible to effectively transmit the magnetic flux of the magnet 12 to opposing magnetic bodies. Therefore, the magnetic attraction is increased, and it is possible to improve the click feeling generated when the rotary knob 20 is operated by the change of the magnetic attraction. In addition, it is possible to securely stop the rotary knob 20 while the rotation position in which the inward protrusions 21a and the outward protrusions 11a oppose each other is defined as the defined position. Moreover, unlike a mechanism in which the click feeling is applied by a friction force of a sliding portion, since the click feeling can be applied in a non-contact manner by the magnetic attraction, it is possible to decrease an operation sound. In addition, strong click feeling can be generated in a non-contact manner, and thus, deterioration due to the friction is decreased.

Moreover, since the magnet 12 is vertically magnetized, a simple structure is obtained even when the magnet is an annular shape, and the manufacturing of the magnet is easy. In addition, since a single magnetization is sufficient with respect to the entire annular magnetic body, it is possible to decrease the cost.

Accordingly, it is possible to provide the rotary input device 1 in which the cost can be decreased and the click feeling is improved.

Second Embodiment

Figure 13:
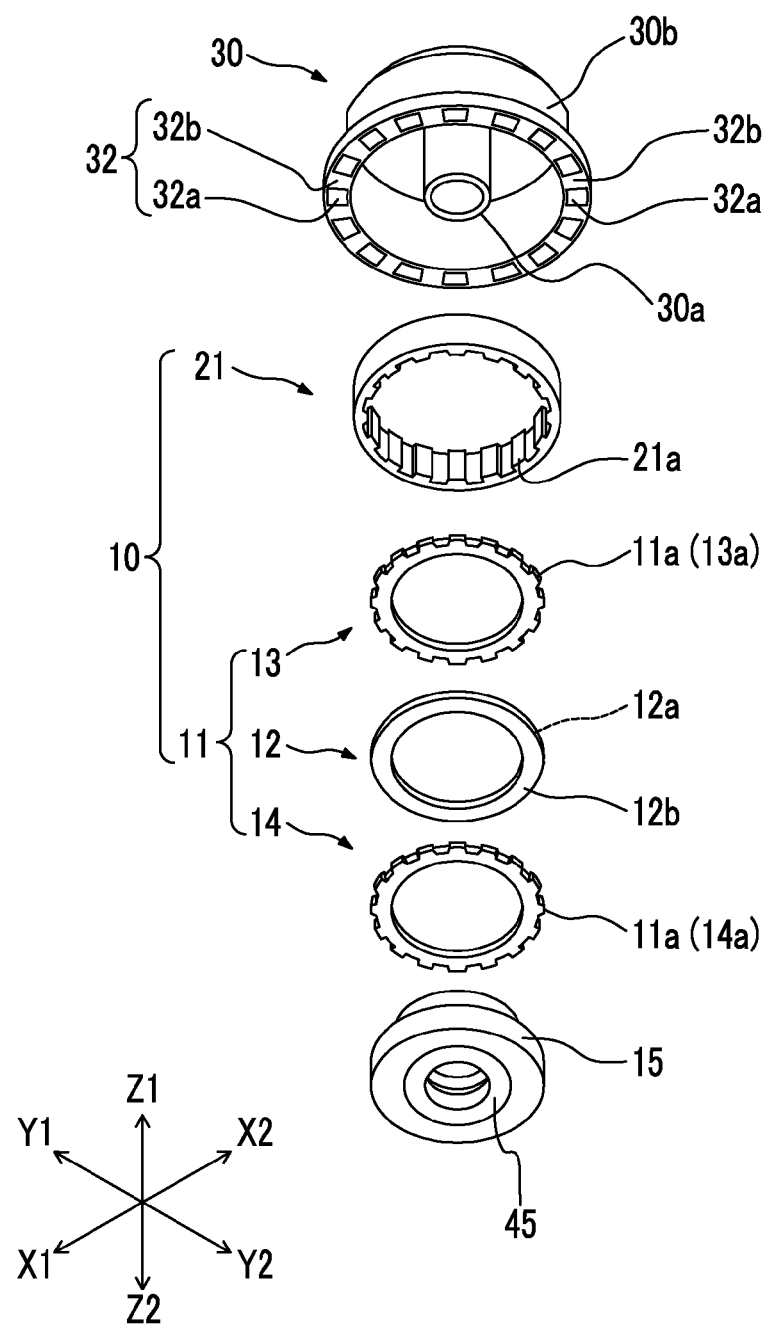
FIG. 13 is an exploded perspective view showing a rotary knob and a click feeling generating portion in a rotary input device of a second embodiment of the present invention.
Figure 14:
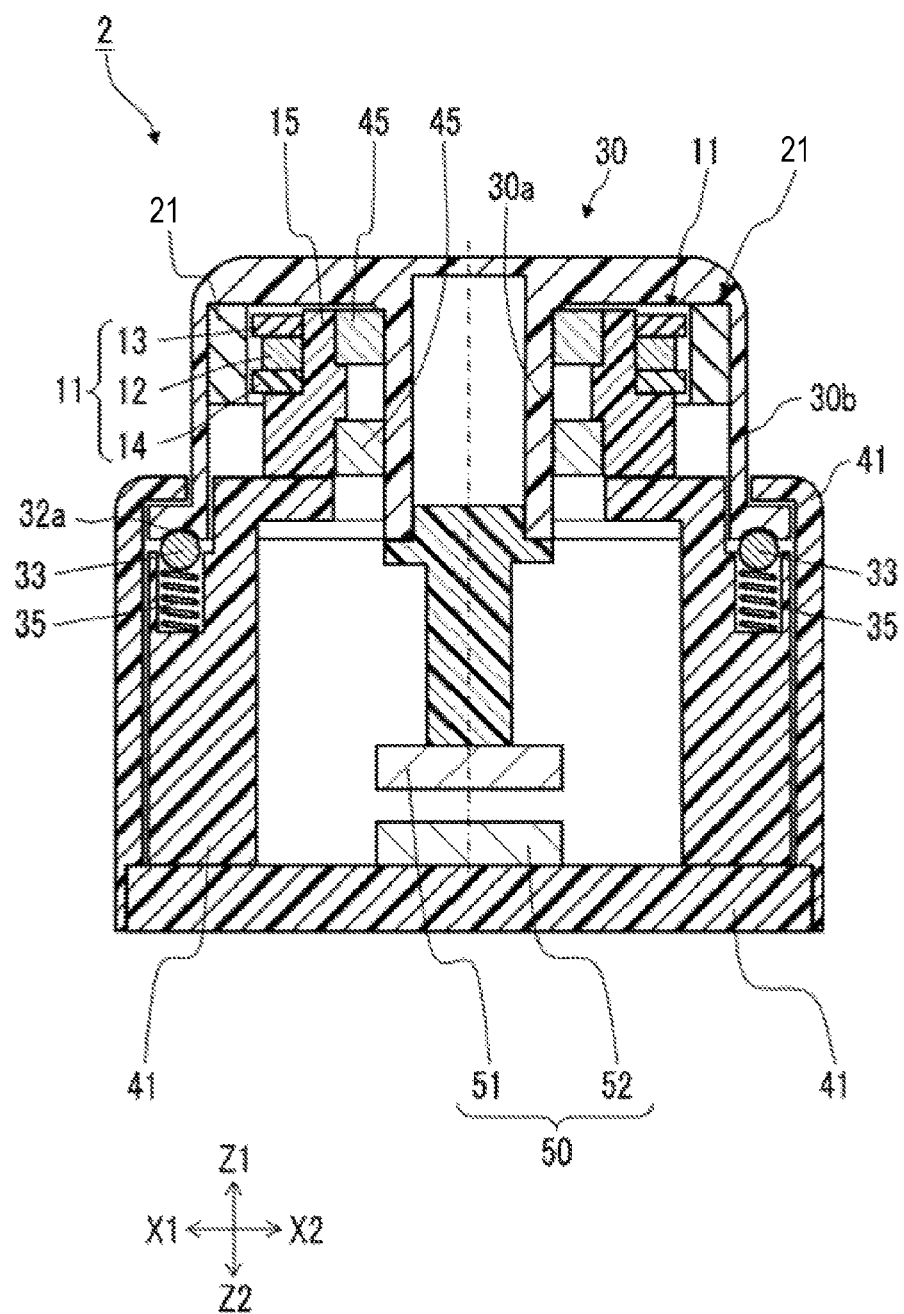
FIG. 14 is a cross-sectional view showing a rotary input device of the second embodiment.

FIG. 13 is an exploded perspective view showing a rotary knob 30 and the click feeling generating portion 10 in a rotary input device 2 of a second embodiment. FIG. 14 is a cross-sectional view of the rotary input device 2 which is cut similar to that in FIG. 5.

In the rotary input device 2 of the second embodiment, the rotary knob 30 and a case member 41 are different from those of the rotary input device 1 of the first embodiment. Other members are the same as in the first embodiment, and thus, the same reference numerals are used, and the descriptions thereof are omitted.

The rotary knob 30 is a molding member that includes a cylindrical operating portion 30b, and a shaft portion 30a that is concentrically formed with the operating portion 30b. The rotary knob 30 is accommodated in the case member 41 that rotatably supports the rotary knob 30, and the operating portion 30b protrudes from an opening of the case member 41.

As shown in FIG. 13, in the rotary input device 2 of the present embodiment, a sliding portion 32 having a continuous concave shape 32a and a continuous convex shape 32b is formed on the lower surface of the rotary knob 30. Moreover, as shown in FIG. 14, a spherical body 33 and an elastic member 35 biasing the spherical body 33 are disposed between the case member 41 and the rotary knob 30. The spherical body 33, the elastic member 35 biasing the spherical body 33, and the sliding portion 32 including the continuous concave shape 32a and the continuous convex shape 32b formed on the rotary knob 30 configure the cam member. In the sliding portion 32, the rotation position at which the inward protrusions 21a and the outward protrusions 11a oppose each other becomes a maximum point of the concave shape 32a, and the rotation position corresponding to an intermediate position of the inward protrusion 21a and the outward protrusion 11a becomes a maximum point of the convex shape 32b when the inward protrusions 21a and the outward protrusions 11a are relatively rotated. When viewed from the rotary knob 30, the spherical body 33 relatively moves on the sliding portion 32 against an elastic force applied from the elastic member 35 according to the operation of the rotary knob 30.

The cam member positions the rotary knob 30 with the rotation position at which the inward protrusions 21a and the outward protrusions 11a oppose each other as the defined position, and applies the operation reaction force to the rotary knob 30 when the rotary knob 30 is rotated from the defined position. Accordingly, it is possible to prevent the rotary knob 30 from not being stopped and being continuously vibrated, and it is possible to limit the continuous rotation. Moreover, since the click feeling is generated by the change of the magnetic attraction, the operation reaction force generated in the cam member may be decreased. If so, the friction force or the like applied to the cam member is decreased.

Hereinafter, effects according to the present embodiment will be described.

In the rotary input device 2 of the present embodiment, the case member 41 that rotatably supports the rotary knob 30 is provided, and the cam member is provided between the case member 41 and the rotary knob 30. The cam member positions the rotary knob 30 with the rotation position at which the inward protrusions 21a and the outward protrusions 11a oppose each other as the defined position, and applies the operation reaction force to the rotary knob 30 when the rotary knob 30 is rotated from the defined position. According to this configuration, since the cam member applies the operation reaction force to the rotary knob 30, it is possible to prevent the rotary knob 30 from not being stopped and being continuously vibrated, and it is possible to limit the continuous rotation. Moreover, since the click feeling is generated by the change of the magnetic attraction, the operation reaction force generated in the cam member may be decreased. Accordingly, since the friction force or the like applied to the cam member is decreased, wear is decreased and the lifespan can be lengthened.

The cam member includes the spherical body 33, the elastic member 35 biasing the spherical body 33, and the sliding portion 32 including the continuous concave shape 32a and the continuous convex shape 32b formed on the rotary knob 30. In the sliding portion 32, the rotation position at which the inward protrusions 21a and the outward protrusions 11a oppose each other becomes the maximum point of the concave shape 32a, and the rotation position corresponding to the intermediate position of the inward protrusion 21a and the outward protrusion 11a becomes the maximum point of the convex shape 32b when the inward protrusions 21a and the outward protrusions 11a are relatively rotated. The spherical body 33 relatively moves on the sliding portion 32 against the elastic force applied from the elastic member 35 according to the operation of the rotary knob 30. According to this configuration, since the cam member can be configured by a simple structure, it is possible to decrease the cost. In addition, since the click feeling is generated by the change of the magnetic attraction, it is possible to decrease the elastic force of the elastic member 35 generating the operation reaction force, and thus, the operation sound or the wear due to the sliding is not easily generated.

Third Embodiment

Figure 15:
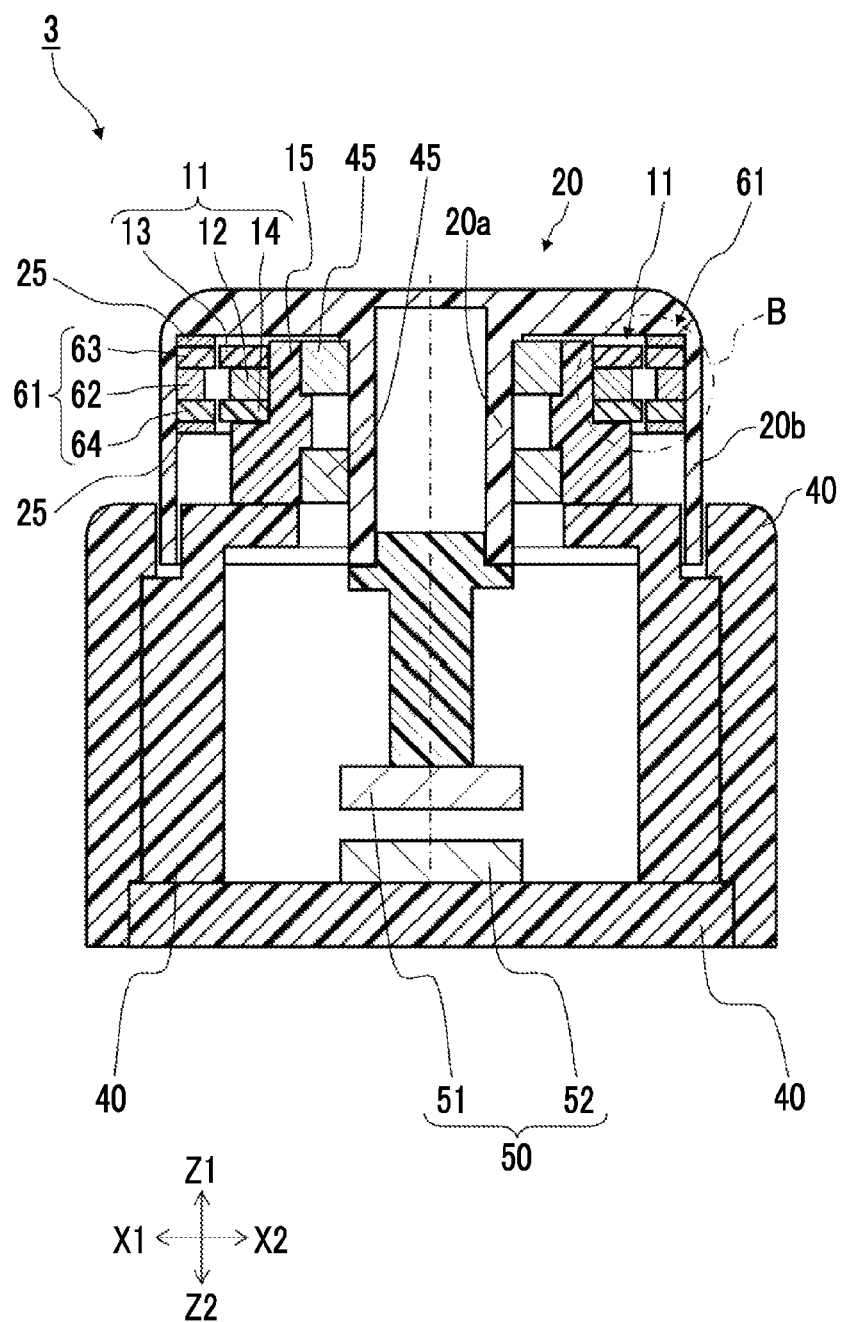
FIG. 15 is a cross-sectional view showing a rotary input device of a third embodiment of the present invention.

FIG. 15 is a cross-sectional view showing a rotary input device 3 of a third embodiment. FIG. 16 is an explanatory view showing flows of the magnetic flux of a first magnetic body and a second magnetic body in a B portion of FIG. 15.

In the rotary input device 3 of the third embodiment, a second magnetic body 61 is different from that of the rotary input device 1 of the first embodiment. Other members are the same as in the first embodiment, and thus, the same reference numerals are used, and the descriptions thereof are omitted.

As shown in FIG. 15, the rotary input device 3 of the third embodiment includes the second magnetic body 61, a magnet 62, and a pair of yokes 63 and 64. The second magnetic body 61 is positioned vertically (Z1-Z2 direction) by a fixing member 25, and is inserted to be fixed to the operating portion 20b of the rotary knob 20.

As shown in FIG. 16, in the rotary input device 3 of the present embodiment, the first magnetic body 11 includes the magnet 12, the pair of yokes 13 and 14, and the outward protrusions 13a and 14a formed on the pair of yokes 13 and 14. Moreover, as shown in FIG. 16, the second magnetic body 61 includes an inward protrusion 61a. The inward protrusion 61a of the second magnetic body 61 is formed in two rows of upper and lower portions (inward protrusion 63a of yoke 63 and inward protrusion 64a of yoke 64) to oppose the outward protrusion 11a of the first magnetic body 11 (outward protrusion 13a of yoke 13 and outward protrusion 14a of yoke 14). The magnet 12 of the first magnetic body 11 and the magnet 62 of the second magnetic body 61 are positioned to be vertically inverted to each other and to be magnetized. Moreover, the inward protrusion 61a and the outward protrusion 11a are disposed so that the rotation position at which the inward protrusion 61a and the outward protrusion 11a oppose each other becomes a defined position.

As shown in FIG. 16, the first magnetic body 11 and the second magnetic body 61 include the magnets 12 and 62, respectively, and the magnets 12 and 62 are disposed to attract each other. Accordingly, the magnetic attraction is generated between the first magnetic body 11 and the second magnetic body 61, and the first magnetic body and the second magnetic body are stable in the defined position at which the inward protrusion 21a and the outward protrusion 11a oppose each other. If the operating portion 20b of the rotary knob 20 is rotated from the defined position, the operation feeling is generated by the magnetic attraction.

Hereinafter, effects according to the present embodiment will be described.

In the rotary input device 3 of the present embodiment, the first magnetic body 11 includes the magnet 12, the pair of yokes 13 and 14, and the outward protrusions 13a and 14a formed on the pair of yokes 13 and 14. The second magnetic body 61 includes the magnet 62, the pair of yokes 63 and 64, and the inward protrusions 63a and 64a formed on the pair of yokes 63 and 64. The magnet 12 of the first magnetic body 11 and the magnet 62 of the second magnetic body 61 are positioned to be vertically inverted to each other and to be magnetized. In addition, the inward protrusion 61a is formed in two rows of upper and lower portions (inward protrusion 63a of yoke 63 and inward protrusion 64a of yoke 64) to oppose the outward protrusion 11a of the first magnetic body 11 (outward protrusion 13a of yoke 13 and outward protrusion 14a of yoke 14), and the inward protrusion 61a and the outward protrusion 11a are disposed so that the rotation position at which the inward protrusion 61a and the outward protrusion 11a oppose each other becomes the defined position.

According to this configuration, the first magnetic body 11 and the second magnetic body 61 include the magnets 12 and 62, respectively, the magnets 12 and 62 are disposed to attract each other, and thus, it is possible to further increase the magnetic attraction. Accordingly, the magnetic attraction is increased, and an improved click feeling is easily obtained.

Fourth Embodiment

Figure 17:
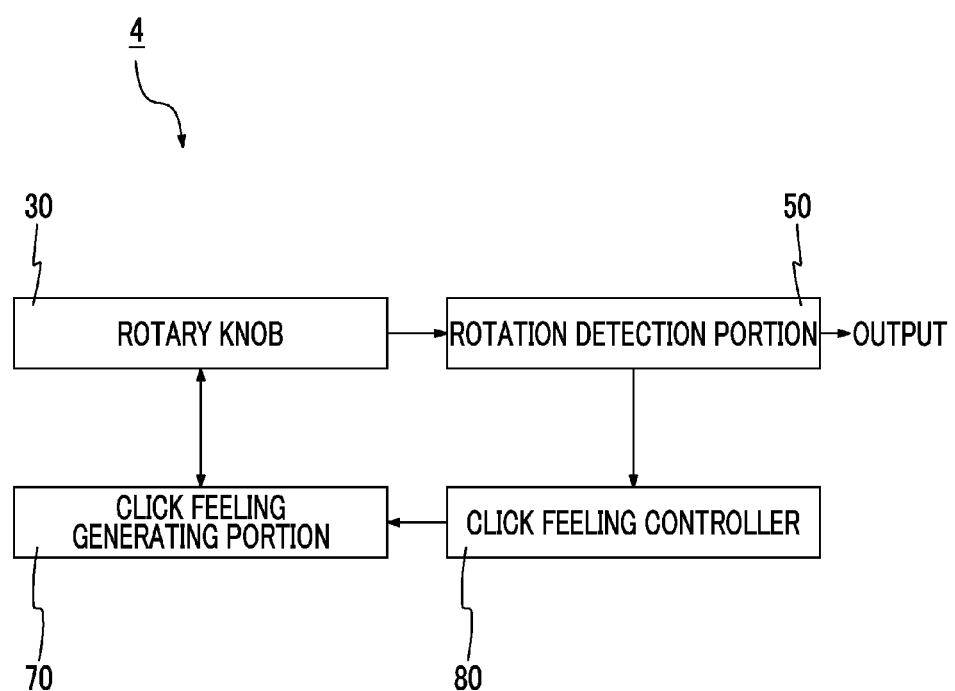
FIG. 17 is a block diagram showing a rotary input device of a fourth embodiment of the present invention.
Figure 18:
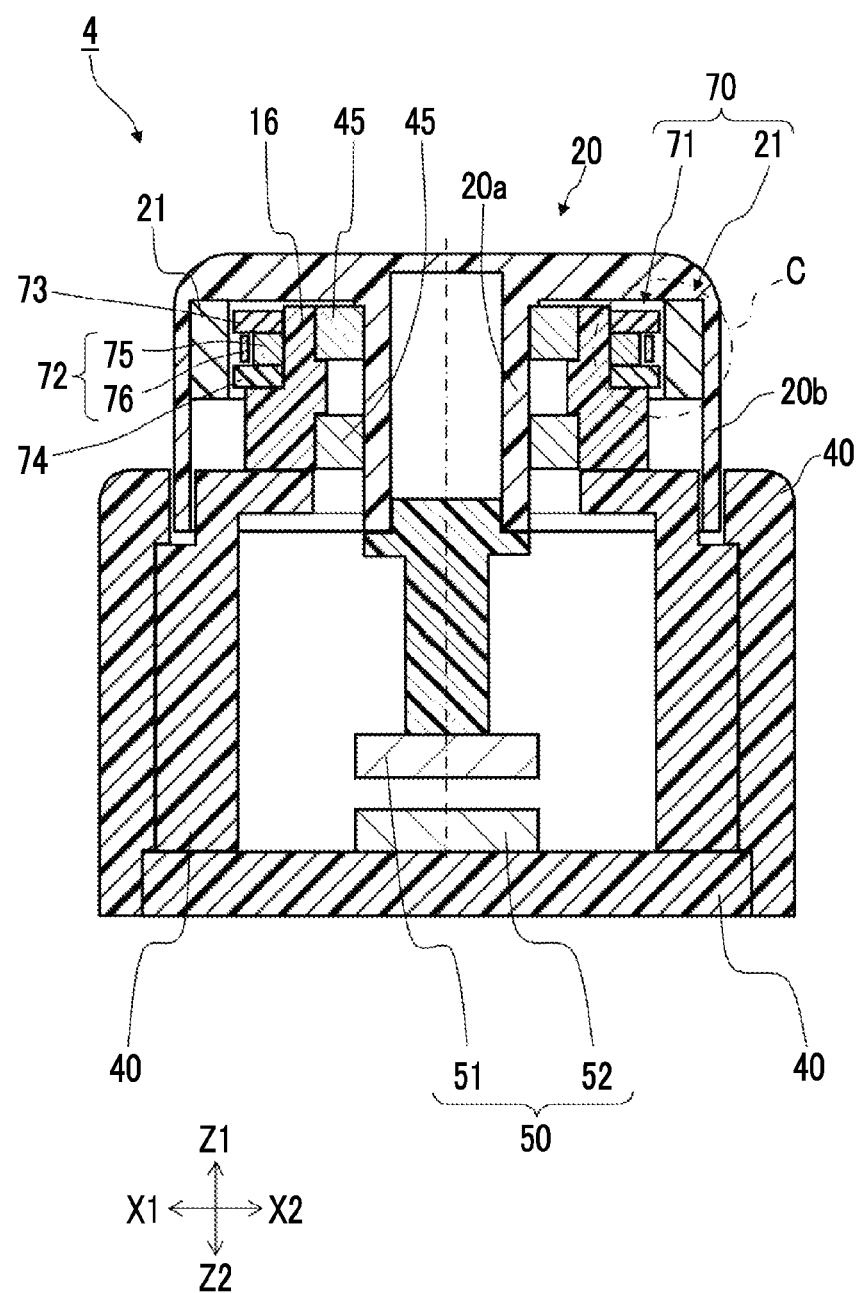
FIG. 18 is a cross-sectional view showing the rotary input device of the fourth embodiment.
Figure 19:
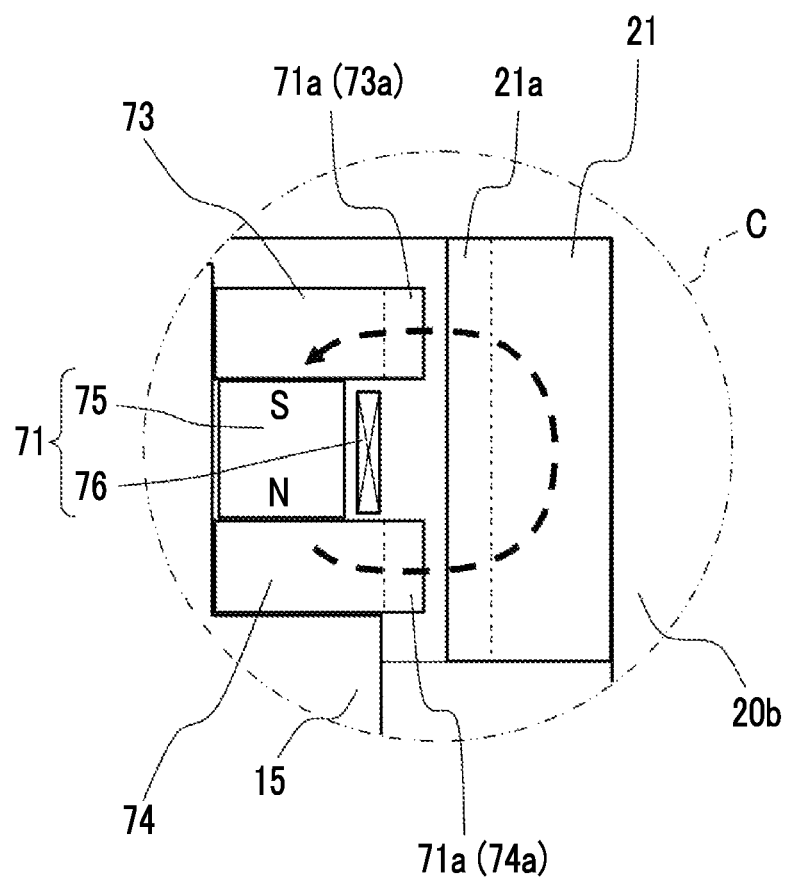
FIG. 19 is an explanatory view showing flows of magnetic flux of a first magnetic body and a second magnetic body in a C portion of FIG. 18.

FIG. 17 is a block diagram showing a rotary input device 4 of a fourth embodiment of the present invention. FIG. 18 is a cross-sectional view showing the rotary input device 4 of the fourth embodiment. FIG. 19 is an explanatory view showing flows of magnetic flux of the first magnetic body 71 and the second magnetic body 21 in a C portion of FIG. 18.

As shown in FIG. 17, the rotary input device 4 of the present embodiment includes a click feeling generating portion 70 and a click feeling controller 80 controlling the click feeling generating portion 70. In addition, as shown in FIG. 18, the first magnetic body 71 includes a magnet 72 and a pair of yokes 73 and 74. In addition, the magnet 72 is an electromagnet that includes a core material 75 and a coil material 76 wound around the core material 75. Other members are the same as in the first embodiment, and thus, the same reference numerals are used, and the descriptions thereof are omitted.

The click feeling generating portion 70 is disposed so that the first magnetic body 71 and the second magnetic body 21 are relatively rotated. In the present embodiment, the first magnetic body 71 includes outward protrusions 71a. The pair of yokes 73 and 74 is magnetic materials molded in an annular shape, and in the present embodiment, a steel material is used. The outward protrusion 71a of the first magnetic body 71 is formed to be divided into an outward protrusion 73a of the yoke 73 and an outward protrusion 74a of the yoke 74 of the upper portion and the lower portion.

The core material 75 is a magnetic material formed in a cylindrical shape, and in the present embodiment, a steel material is used. The coil material 76 is wound around the outer circumference of the core material 75, and the coil material 76 is connected to the click feeling controller 80 by a wire (not shown). The coil material 76 is energized, and thus, the magnet 72 is excited, and a state where the magnet is magnetized to two poles of the upper portion and the lower portion is realized.

The inward protrusion 21a of the second magnetic body 21 and the outward protrusion 71a of the first magnetic body 71 are disposed so that the rotation position at which the inward protrusion and the outward protrusion oppose each other becomes the defined position. At this time, the coil material 76 is energized, and thus, the magnetic attraction is generated between the first magnetic body 11 and the second magnetic body 21, and the first magnetic body and the second magnetic body are stable in the defined position at which the inward protrusions 21a and the outward protrusions 71a oppose each other. If the operating portion 20b of the rotary knob 20 is rotated from the defined position, operation feeling is generated by the magnetic attraction.

When the coil material 76 is not energized, the magnet 72 is not magnetized, and the magnetic attraction may not be generated. In this state, the click feeling is not generated even when the operating portion 20b of the rotary knob 20 is rotated, and it is possible to freely rotate the operating portion. Meanwhile, if the energized current is increased, strong magnetic attraction can be generated, and thus, it is possible to obtain a strong click feeling at a predetermined rotation angle according to the output of the rotation detection portion 50. Accordingly, it is possible to control the magnetic attraction, and thus, it is possible freely change the operation feeling.

Moreover, similar to the pair of yokes 73 and 74, the core material 75 is formed in an annular shape, the coil material 76 is wound around the outer circumference. However, the coil material may be disposed to be distributed on a portion of the circumference. For example, according to the disposition of the outward protrusion 71a, the core material 75 and the coil material 76 are disposed on each position.

Hereinafter, effects according to the present embodiment will be described.

In the rotary input device 4 of the present embodiment, the magnet 72 is an electromagnet that includes the core material 75 and the coil material 76 wound around the core material 75. According to this configuration, the magnet 72 is an electromagnet, and since it is possible to control the magnetic attraction by energizing the coil material 76, it is possible to freely change the operation feeling.

As above, embodiments of the present invention are described in detail. However, the present invention is not limited to the above-described embodiments, and various modifications may be performed within a scope which does not depart from the gist. For example, the following modifications are possible, and the modifications are also included in the technical range of the present invention.

Figure 20:
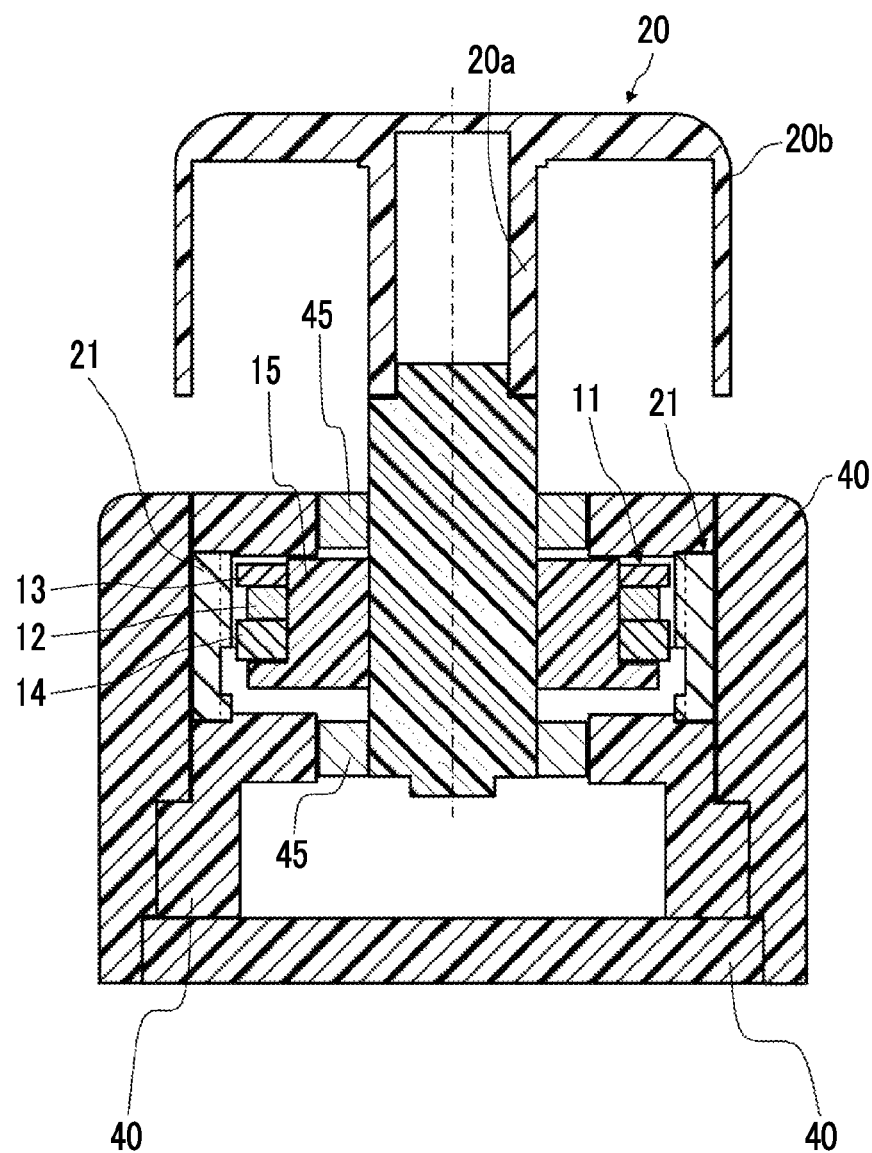
FIG. 20 is a cross-sectional view showing a first modification of the first embodiment.

(1) In the first embodiment, the second magnetic body 21 is fixed to the operating portion 20b of the rotary knob 20, and the first magnetic body 11 is fixed to the case member 40. However, the first magnetic body 11 may be fixed to be integrally rotated with the shaft portion 20a of the rotary knob 20. FIGS. 20 and 21 are cross-sectional views showing a first modification of the first embodiment. In the present modification, it is possible to press the rotary knob 20, and in order to obtain the click feeling according to the pushing-down operation, the shapes of the first magnetic body 11 and the second magnetic body 21 are studied. In addition, in FIGS. 20 and 21, a mechanism for detecting the rotation and the pushing-down is omitted.

Figure 23:
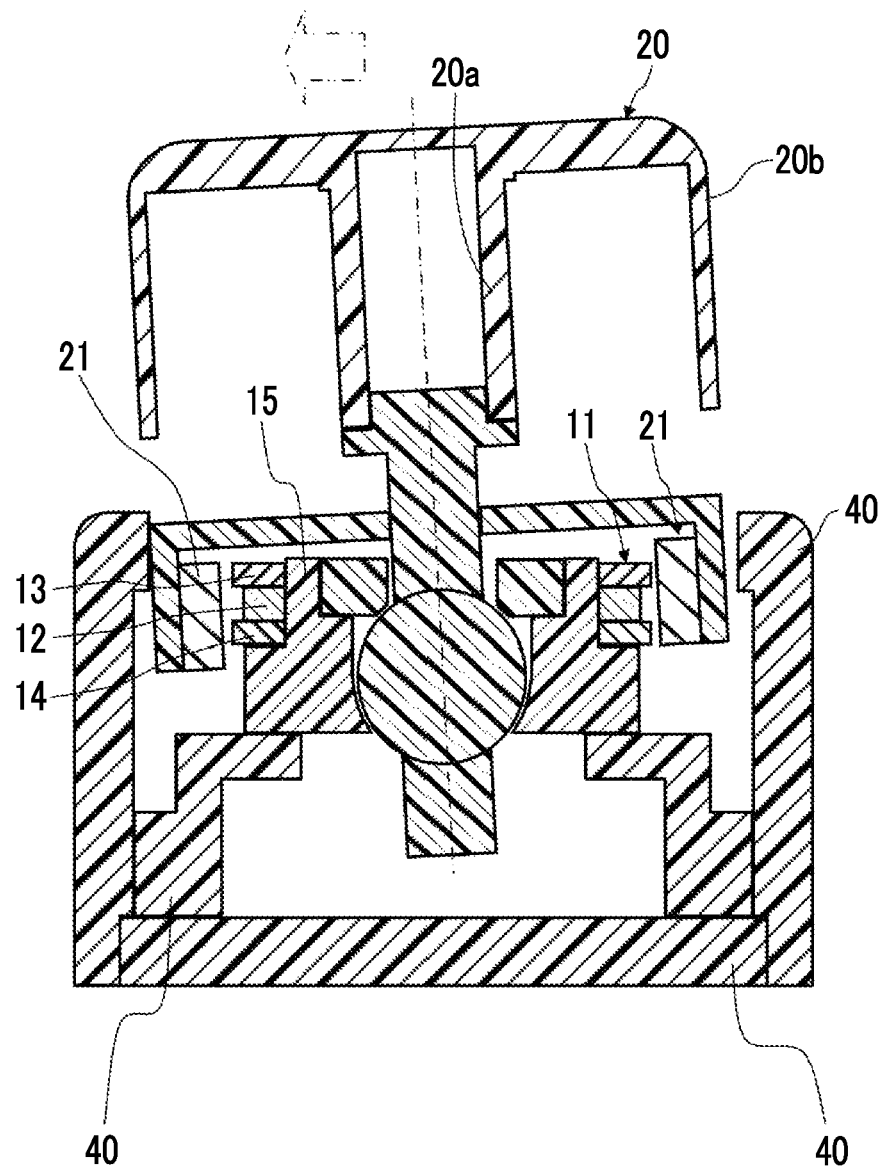
FIG. 23 is a cross-sectional view showing the second modification of the first embodiment, and is an explanatory view of a tilting operation.
Figure 24:
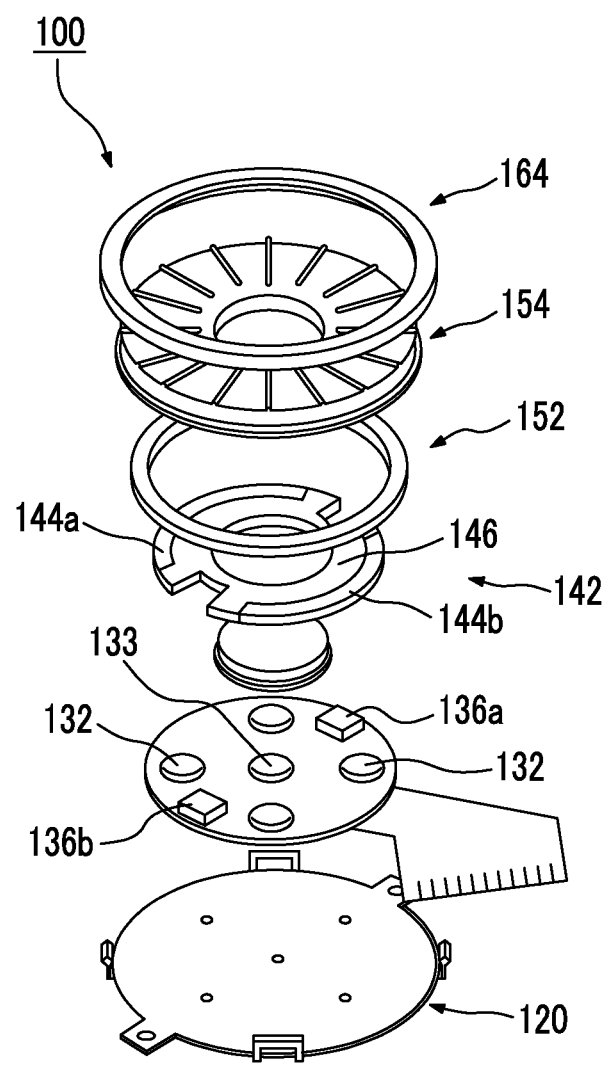
FIG. 24 is an exploded perspective view showing an information input device in the related art.
Figure 25A:
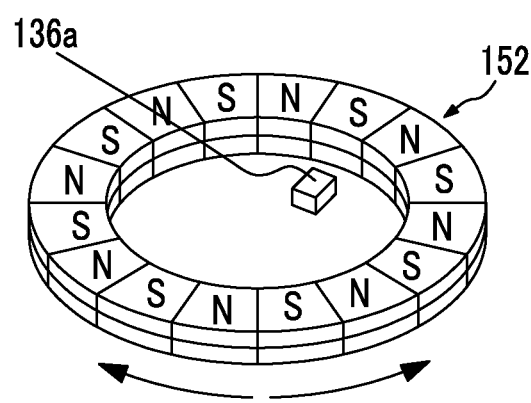
FIGS. 25A and 25B are perspective views showing a rotation detection magnetic body of FIG. 24.
Figure 25B:
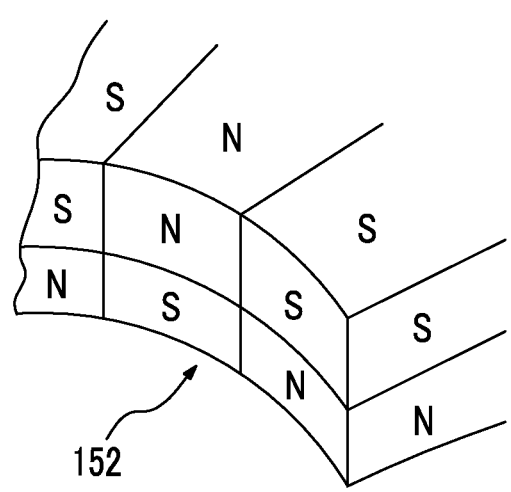

(2) In the first embodiment, the rotary shaft of the rotary knob 20 is fixed and the rotation operation is performed. However, the embodiment may be modified so that a tilting operation is also performed. FIGS. 22 and 23 are cross-sectional views showing a second modification of the first embodiment. In the present modification, the tilting operation of the rotary knob 20 is possible, and in order to obtain the click feeling according to the tilting operation, it is devised that the second magnetic body 21 is integrally tilted with the rotary knob 20. In addition, in FIGS. 22 and 23, a mechanism for detecting the tilting and the pushing-down is omitted.

(3) In the first and second embodiments, the magnet 12 is used in the first magnetic body 11. However, the embodiments may be modified so that the magnet is used on the second magnetic body 21 side.

(4) In the first to fourth embodiments, the pair of yokes includes the vertical outward protrusions. However, the outward protrusion may be formed on only one of the upper yoke and the lower yoke. However, since the yoke in which the outward protrusion is not formed does not have a function generating the click feeling, the obtained click feeling is weak. In addition, if a magnet that is more strongly magnetized is used, it is possible to prevent the click feeling from being decreased.

(5) In the first to fourth embodiment, if the number of the outward protrusions and the inward protrusions or the pitch in the circumference direction is changed, it is possible to change the frequency of the click feeling when being rotated once, the click feeling by the rotation position, or the like. Moreover, the number of the outward protrusions and the number of the inward protrusions may not be the same as each other. Since the strength of the click feeling generated at the rotation angle at which the outward protrusion and the inward protrusion oppose each other is dependent on the number of the opposing outward protrusions and inward protrusions, it is possible to change the click feeling by the rotation position.

In addition, in the first to fourth embodiments, the rotary knob is provided. However, instead of the rotary knob or in a portion of the rotary knob, a lever member which performs an arc-like operation may be attached to protrude to the side. In this case, the rotation center of the lever member may be coaxial with the rotation center of the rotary input device. In the strength of the click feeling generated when the operation is performed via the lever member, stronger click feeling may be generated by disposing the rotary input devices on both sides while interposing the lever member.

It should be understood by those skilled in the art that various modifications, combinations, sub-combinations and alterations may occur depending on design requirements and other factors insofar as they are within the scope of the appended claims of the equivalents thereof.

What is claimed is:

1. A rotary input device comprising:
 a first annular magnetic body having a plurality of first protrusions outwardly protruding in a radial direction and disposed along a circumferential direction thereof;
 a second annular magnetic body having a plurality of second protrusions protruding inwardly in a radial direction and disposed along a circumferential direction thereof, each of the second protrusions being configured to oppose corresponding one of the plurality of first protrusions;
 a rotary knob configured to rotate the first magnetic body and the second magnetic body with respect to each other,
 a case member configured to rotatable support the rotary knob; and
 a cam member provided between the case member and the rotary knob,
 wherein the cam member is configured to position the rotary knob with a standard position at which the first and second protrusions face each other, and apply an operation reaction force to the rotary knob when the rotary knob is rotated from the standard position,
 and wherein at least one of the first annular magnetic body and the second annular magnetic body includes:
  a magnet magnetized to have an upper pole and a lower pole on a pair of opposing surfaces thereof; and
  a pair of yokes having the first or second protrusions, the pair of yokes interposing the magnet therebetween so as to face the opposing surfaces of the magnet.

2. The rotary input device according to claim 1, wherein the cam member includes:
 a sliding portion formed on the rotary knob, the sliding portion having a plurality of successively-formed concaves and convexes;
 elastic members disposed in the case member; and
 spherical bodies provided between the sliding portion and the case member such that the elastic body biases the spherical bodies against the sliding portion,
 wherein the spherical bodies align with a concave shape of the concaves when the rotary knob is in the standard position at which the first and second protrusions face, and
 wherein the spherical bodies move along the sliding portion against an elastic force applied from the elastic members as the rotary knob is rotated.

3. The rotary input device according to claim 1, wherein each of the first annular magnetic body and the second annular magnetic body includes the magnet, and the pair of yokes having the first or second protrusions, and
 wherein the magnet of the first annular magnetic body and the magnet of the second annular magnetic body are magnetized in opposite directions.

4. The rotary input device according to claim 1, wherein the magnet is an electromagnet including a core and a coil wound around the core.

* * * * *